US012638816B2

(12) United States Patent
Hall, Jr. et al.

(10) Patent No.: US 12,638,816 B2
(45) Date of Patent: May 26, 2026

(54) MICROCONTROLLER UNIT PLATFORM

(71) Applicant: Johnson Controls Tyco IP Holdings LLP, Milwaukee, WI (US)

(72) Inventors: Robert C. Hall, Jr., Brown Deer, WI (US); Timothy C. Gamroth, Dousman, WI (US); Justin J. Seifi, Cedarburg, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 414 days.

(21) Appl. No.: 18/123,964

(22) Filed: Mar. 20, 2023

(65) Prior Publication Data

US 2024/0319694 A1    Sep. 26, 2024

(51) Int. Cl.
G05B 19/042 (2006.01)
H05K 1/11 (2006.01)

(52) U.S. Cl.
CPC ............ G05B 19/042 (2013.01); H05K 1/111 (2013.01); *G05B 2219/25011* (2013.01); *G05B 2219/25257* (2013.01); *G05B 2219/2614* (2013.01); *H05K 2201/09409* (2013.01)

(58) Field of Classification Search
CPC ........ G05B 19/042; G05B 2219/25011; G05B 2219/25257; G05B 2219/2614; H05K 1/111; H05K 2201/09409
See application file for complete search history.

(56) References Cited

U.S. PATENT DOCUMENTS

| | | | |
|---|---|---|---|
| 5,049,084 | A | 9/1991 | Bakke |
| D368,903 | S | 4/1996 | Ohmori |
| D387,746 | S | 12/1997 | Ishihara |
| D387,747 | S | 12/1997 | Ishihara |
| D388,066 | S | 12/1997 | Ishihara |
| D389,130 | S | 1/1998 | Ishihara |
| D459,706 | S | 7/2002 | Ebihara |
| D466,093 | S | 11/2002 | Ebihara et al. |
| D471,167 | S | 3/2003 | Hitoshi et al. |

(Continued)

FOREIGN PATENT DOCUMENTS

| | | | |
|---|---|---|---|
| CN | 211209377 U | * | 8/2020 |
| CN | 306993142 | | 12/2021 |

(Continued)

OTHER PUBLICATIONS

Translation of CN-211209377-U (Year: 2020).*

(Continued)

*Primary Examiner* — Henry Tsai
*Assistant Examiner* — John B Roche
(74) *Attorney, Agent, or Firm* — Foley & Lardner LLP

(57) ABSTRACT

A building device including a circuit board having a plurality of connection points, and a microcontroller (MCU) module having a plurality of pads and a plurality of receivers, each of the plurality of pads to connect to one of the plurality of connection points of the circuit board, and each of the plurality of receivers to removably couple a pin of a plurality of pins of a microcontroller. The microcontroller configured, via an interface, to route a signal from a pin of the plurality of pins of the microcontroller to a connection point of the plurality of connection points of the circuit board, via a pad of the plurality of pads of the MCU module.

19 Claims, 19 Drawing Sheets

(56) References Cited

U.S. PATENT DOCUMENTS

| | | | |
|---|---|---|---|
| D485,536 S | 1/2004 | Dang et al. | |
| D523,403 S | 6/2006 | Mizukoshi | |
| D526,972 S | 8/2006 | Egawa et al. | |
| D571,810 S | 6/2008 | Ikeda | |
| 7,794,098 B2 | 9/2010 | Chang | |
| D673,922 S | 1/2013 | Moriai | |
| D691,101 S | 10/2013 | Lshizawa | |
| D699,201 S | 2/2014 | Petsch | |
| D713,362 S | 9/2014 | Sinai | |
| D715,234 S | 10/2014 | Chan et al. | |
| D754,083 S | 4/2016 | Vinciarelli et al. | |
| D761,745 S | 7/2016 | Shinkai | |
| D775,093 S | 12/2016 | Vinciarelli et al. | |
| D792,410 S | 7/2017 | Beals et al. | |
| D837,171 S | 1/2019 | Vasoya | |
| 10,218,114 B2 * | 2/2019 | Tham | H02J 7/0068 |
| D856,948 S | 8/2019 | Vasoya | |
| D869,469 S | 12/2019 | Lim | |
| 10,510,626 B2 | 12/2019 | Braun | |
| 10,600,789 B2 | 3/2020 | Ha et al. | |
| 10,636,703 B2 | 4/2020 | Jeong | |
| D893,439 S | 8/2020 | Vasoya | |
| D902,164 S | 11/2020 | Kondo | |
| D934,820 S | 11/2021 | Okawa et al. | |
| D934,821 S | 11/2021 | Taguchi et al. | |
| D937,233 S | 11/2021 | Okawa et al. | |
| D942,974 S | 2/2022 | Horn | |
| D947,800 S | 4/2022 | Cook | |
| D949,864 S | 4/2022 | Beals et al. | |
| D954,006 S | 6/2022 | Van De Kamp | |
| D956,707 S | 7/2022 | Yamauchi | |
| 11,562,155 B2 | 1/2023 | Nakamura | |
| D984,397 S | 4/2023 | Cai | |
| D1,022,931 S | 4/2024 | Kannan | |
| 12,147,209 B2 | 11/2024 | Martorana | |
| D1,054,404 S | 12/2024 | Horn | |
| D1,059,313 S | 1/2025 | Mao | |
| D1,087,043 S | 8/2025 | Shrikhande | |
| 2003/0016129 A1 | 1/2003 | Menard et al. | |
| 2010/0155919 A1 * | 6/2010 | Song | H01L 25/105 |
| | | | 257/690 |
| 2013/0262964 A1 | 10/2013 | Winker | |
| 2015/0316903 A1 | 11/2015 | Asmus et al. | |
| 2018/0157782 A1 * | 6/2018 | Rossi | H01L 25/0655 |
| 2019/0234786 A1 | 8/2019 | Klicpera | |
| 2021/0336775 A1 | 10/2021 | Gu et al. | |
| 2025/0225854 A1 | 7/2025 | Al-Rasheed et al. | |

FOREIGN PATENT DOCUMENTS

| | | | |
|---|---|---|---|
| CN | 215451421 U | * | 1/2022 |
| CN | 217900151 U | * | 11/2022 |
| CN | 309443700 | | 8/2025 |

OTHER PUBLICATIONS

Translation of CN-215451421-U (Year: 2022).*

Translation of CN-217900151-U (Year: 2022).*

CN-215451421-U translation (Year: 2022).*

CN-217900151-U translation (Year: 2022).*

6Pcs MC9S12XET256MAL 16-bit Microcontrollers—MCU 16BIT 256K Flash 16K RAM, https://WWW.ebay.com/itm/ 365711461484, 2024 (pp. 1-12).

Jotrin Electronics—ULP 32-Bit Microcontroller Platform powers IoT applications.https://www.jotrin.com/technology/details/ulp-32-bit-microcontroller-platform-powers-iot-applications?srsltid= AfmBOooq UjS30_8cTzKQdSgGRTyX08h26UAx7ldtGZyBJ-GchtZPcPSx, Jan. 6, 2020 (pp. 1-9).

* cited by examiner

800

802 — Obtain device data for a device of building equipment

804 — Obtain MCU data for a MCU

806 — Generate one or more profiles correlating the device of building equipment and the MCU 808 — Generate an interface based on the one or more profiles 810 — Communicate the interface to the MCU

MICROCONTROLLER UNIT PLATFORM

BACKGROUND

The present disclosure relates generally to a controller for building equipment, such as chillers, boilers, air handling units, and other types of building equipment, and more particularly a controller having a microcontroller unit configured to facilitate communication between a first device and a second device to initiate an automated action.

SUMMARY

At least one embodiment relates to a building device. The building device includes a circuit board having a plurality of connection points, and a microcontroller (MCU) module having a plurality of pads and a plurality of receivers, each of the plurality of pads to connect to one of the plurality of connection points of the circuit board, and each of the plurality of receivers to removably couple a pin of a plurality of pins of a microcontroller. The microcontroller is configured, via an interface, to route a signal from a pin of the plurality of pins of the microcontroller to a connection point of the plurality of connection points of the circuit board, via a pad of the plurality of pads of the MCU module Another embodiment relates to a system for monitoring and controlling a device of building equipment. The system includes one or more memory devices having instructions stored thereon that, when executed by one or more processors, cause the one or more processors to perform operations. The operations comprise receiving, via the device of building equipment, device data relating to the device of building equipment, and receiving, via a microcontroller (MCU), MCU data relating to the MCU. The operations further comprise generating one or more profiles correlating the device of building equipment and the MCU based on the device data and the MCU data, generating, based on the one or more profiles, an interface, where the interface is configured to route a signal from a pin of the MCU to one or more connection points of a circuit board of the device of building equipment. The operations also comprise communicating the interface to the MCU, where the MCU, via the interface, is configured to route the signal from the pin of the MCU to the one or more connection points of the circuit board of the device of building equipment to initiate an automated action.

Another embodiment relates to a device for monitoring and controlling building equipment. The device including a plurality of pins, each of the plurality of pins associated with an automated action of the device, and one or more memory devices having instructions stored thereon that, when executed by one or more processors, cause the one or more processors to perform operations. The operations comprise receiving an interface, and receiving a signal at a first pin of the plurality of pins, where the signal is associated with a first automated action. The operations also comprise identifying, via the interface and based on the signal, a connection point of a second device, and routing, via the interface, the signal to the connection point of the second device to initiate the first automated action.

This summary is illustrative only and should not be regarded as limiting.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION

Figure 1:
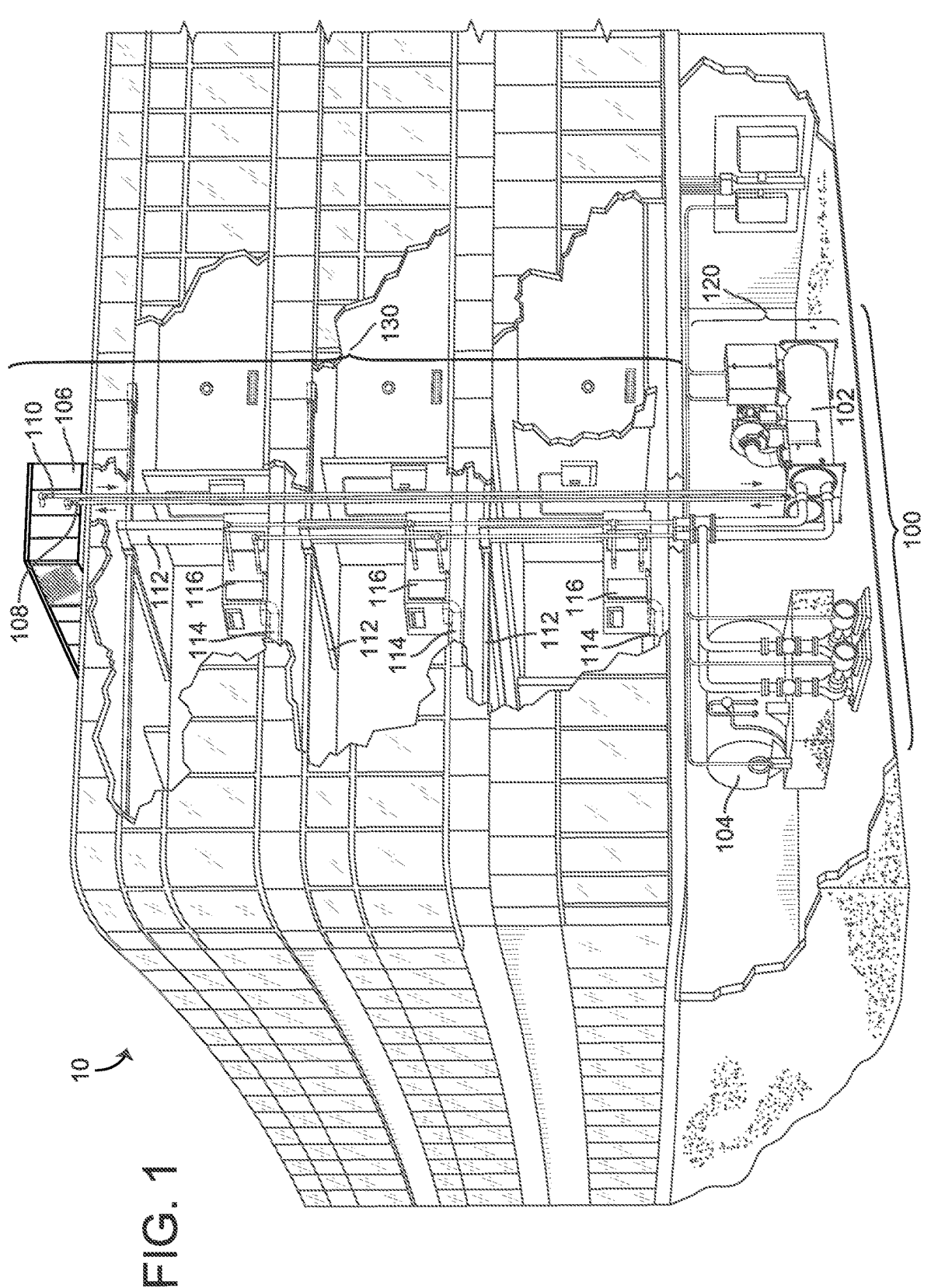
FIG. 1 is a drawing of a building equipped with a building management system (BMS) and a HVAC system, according to some embodiments.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Referring generally to the figures, a chiller is an apparatus that is used to generate temperature controlled water, most often cooled water, which can be used to cool air, products, machines, etc. Chillers may include a controller configured to control one or more digital, electrical, and/or signal processing functions, for example to implement one or more automated actions (e.g., communicate information, initiate or implement control decisions, provide one or more indicators or alerts, etc.). Controllers often include one or more circuits or circuit boards, for example a printed circuit board (e.g., PCB), and/or one or more microcontrollers or microcontroller units (e.g., MCUs). The PCBs and/or MCUs of controllers can include circuitry configured to implement the one or more digital, electrical, and/or signal processing functions of the controller. Further, PCBs and MCUs are often coupled (e.g., via wires, soldering, pins, pads, etc.) to facilitate the communication of signals or calls. However, the compatibility of different PCBs and MCUs is often dependent on the component configurations of the specific PCBs/MCUs to be implemented in the controller (e.g., pin-out diagrams, connection point configurations, input/output configurations, communications protocols, etc.). As such, it would be advantageous to provide systems and devices that permit PCBs and MCUs, with disparate or different configurations, to be compatibly implemented into a controller.

As described herein, it is contemplated that the systems and methods described may be readily applied to various building equipment devices without departing from the teachings of the present disclosure. Building equipment devices may be a device of an HVAC system (e.g., heaters, chillers, heat pumps, air handling units, pumps, fans, thermal energy storage, etc., and/or any other device configured to provide heating, cooling, ventilation, or other services for a building), energy generation and/or storage devices (e.g., thermal storage tanks, battery banks, gas turbines, steam turbines, etc.), a device of a security system (e.g., occupancy sensors, video surveillance cameras, digital video recorders, video processing servers, intrusion detection devices, access control devices and servers, and/or other security-related devices), a device of a lighting system (e.g., light fixtures, ballasts, lighting sensors, dimmers, or other devices configured to controllably adjust the amount of light to a building, etc.), a device of a fire alerting system (e.g., fire detection devices, fire notification devices, fire suppression devices, etc.), and/or a device of any other system that is capable of managing building functions or devices, or any combination thereof.

As also described herein, it is contemplated that the input and/or output signals, calls and/or responses, control signals and/or control decisions described herein may be applied to various automate actions without departing from the teachings of the present disclosure. An automated action may include providing an indication to a device (e.g., a message or alert to a user device, a device of building equipment, a component of a BMS, etc.), for example indicating a characteristic of a device (e.g., operating characteristic, operating parameters, that a fault has been detected, and/or that maintenance should be initiated, etc.). The automated action may also include providing instructions to a device (e.g., instructions to adjust the operating conditions of the device, etc.), controlling one or more components of the (e.g., controlling the device to adjust the operating conditions of the device), controlling one or more components of a building management system, providing an indication to the user device (e.g., providing a GUI on a user interface, providing a message to the user device indicating the device is operating as expected, etc.), providing instructions to a storage system (e.g., instructions to store data and/or automated action data, etc.), and/or any other suitable action relating to the operation of the device and/or another system.

Referring now to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Figure 2:
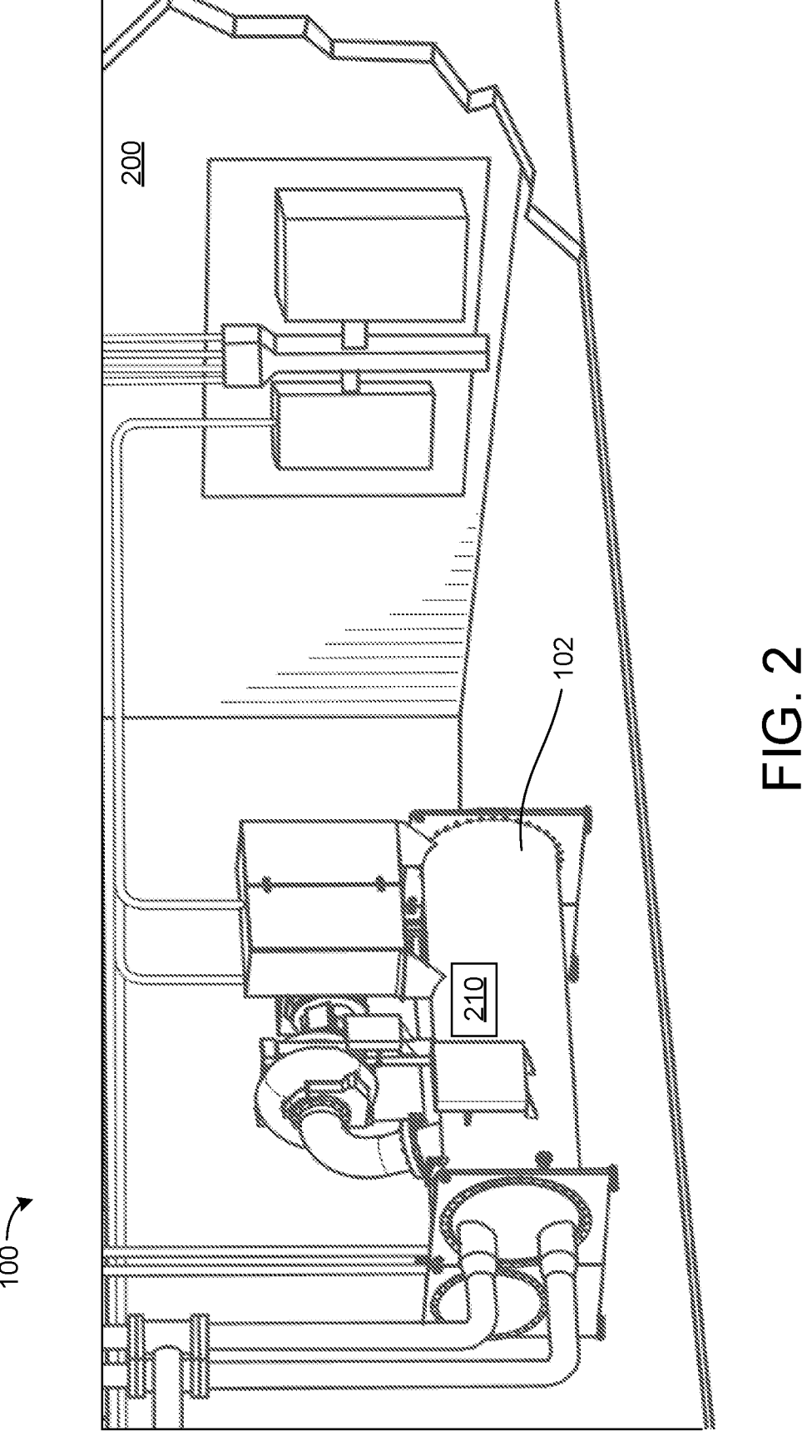
FIG. 2 is an illustration of a controller installed in a piece of building equipment of the building of FIG. 1, according to some embodiments.

Referring now to FIG. 2, a cross-sectional illustration of a portion of the building 10 is shown, according to an exemplary embodiment. As shown in FIG. 2, the building 10 includes a room 200 having a piece of building equipment, shown as the chiller 102. As noted above, building equipment devices may be a device of an HVAC system, energy generation and/or storage system, a device of a lighting system, a device of a fire alerting system, and/or a device of any other system that is capable of managing building functions and/or devices, or any combination thereof. It should be understood that FIG. 2 shows an example configuration suitable for use with the systems and methods described herein.

As shown in FIG. 2, the chiller 102 includes a controller 210. The controller 210 may be communicably coupled with the chiller 102. In the example of FIG. 2, the controller 210 is located within the chiller 102. In some embodiments, the controller 210 is located within the room 200 and/or at another suitable location within or outside the building 10 (e.g., outside the chiller 102). According to an exemplary embodiment, the controller 210 is configured to facilitate the communication of information relating to the chiller 102 (e.g., setpoints, operating parameters, operating characteristics, operating boundaries, etc.), for example between one or more external systems and/or devices, as discussed below. In an exemplary embodiment, the controller 210 is also configured to communicate and/or generate one or more control decisions (e.g., control signals, operating signals, etc.) for the chiller 102, for example to control one or more components of the chiller 102 (e.g., an actuator, valve, pump, motor, condenser, heat exchanger, software, security key, etc.). The controller 210 may be configured specifically for installation in the chiller 102, for example by including specialty mounts or other couplings suited for use with the chiller 102. It should be understood that while the controller 210 is described herein as an example electronic device that may be installed in the chiller 102, many other electronic devices or components may be installed in the chiller 102, the room 200, and/or the building 10, and fall within the scope of the present disclosure (e.g., a microcontroller unit, a micro-computer unit, etc.).

Figure 3:
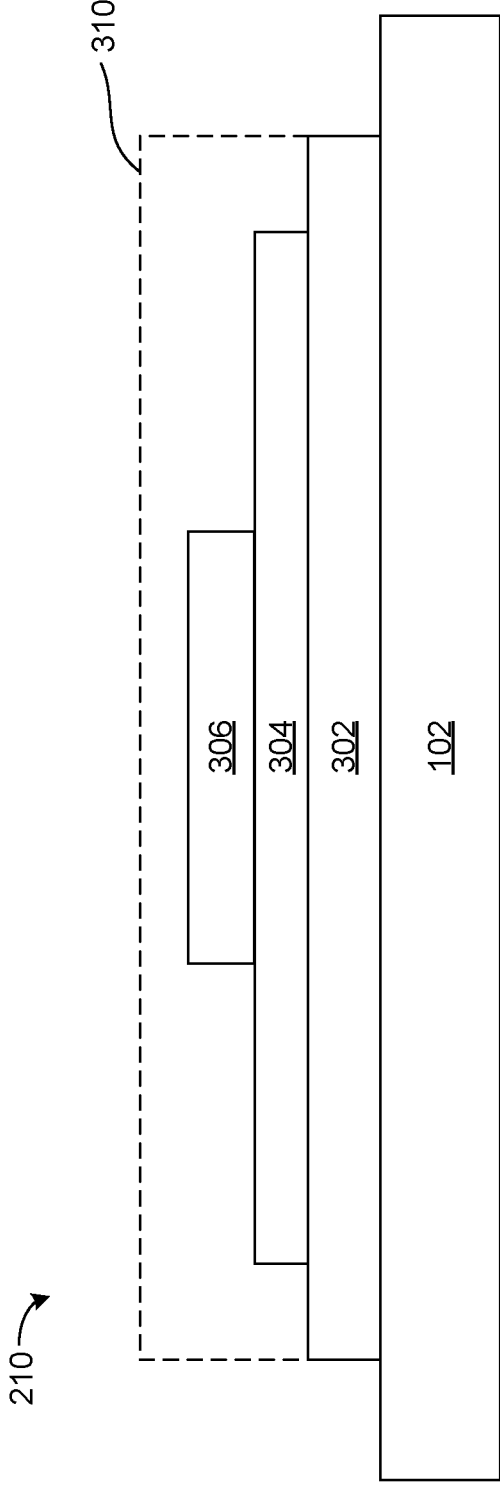
FIG. 3 is a cross-sectional side view of the controller of FIG. 2, according to some embodiments.

Referring now to FIG. 3, a cross-sectional view of the controller 210 is shown, according to an exemplary embodiment. As discussed above, in an exemplary embodiment the controller 210 is coupled with a piece of building equipment, shown as the chiller 102, and is configured to facilitate the communication of information and/or generation of control decisions (e.g., signals) relating to the chiller 102. As shown in FIG. 3, the controller 210 includes a printed circuit board (PCB) 302, a microcontroller (MCU) module or microcontroller unit module, shown as MCU module 304, and a microcontroller or microcontroller unit, shown as MCU 306. The controller 210 may further include a case or housing 310, for example to house and/or protect the various components of the controller 210 (e.g., the PCB 302, the MCU module 304, the MCU 306, etc.).

According to an exemplary embodiment, the PCB 302 is coupled with the piece of building equipment (e.g., the chiller 102), and is configured to communicate information and/or generate control decisions relating to the chiller 102. The PCB 302 may include a circuit board substrate on which circuitry is mounted, printed, and/or installed (e.g., transistors, diodes, resistors, capacitors, etc.). According to an exemplary embodiment, the circuitry is operable to provide data processing and/or data storage for the controller 210 (e.g., to facilitate the communication of information relating to the chiller 102, to generate control decisions or signals for the chiller 102, etc.). In an exemplary embodiment, the PCB 302 includes a plurality of connectors (e.g., mounting components, pins, etc.), for example to facilitate coupling the PCB 302 to one or more components of the controller 210 (e.g., the MCU module 304, the MCU 306, etc.). For example, the PCB 302 may include a plurality of connection points (e.g., pins, etc.) and/or couplings, for example to communicate input/output signals to/from the PCB 302. In an exemplary embodiment, each of the plurality of connection points (e.g., pins, mounts, pads, etc.) are associated with one or more digital, electrical, and/or signal processing functions of the PCB 302 (e.g., the chiller 102, etc.). For example, a first connection point (e.g., pin, mount, pad, etc.) may be associated with a direct voltage current or power measurement (e.g., from the chiller 102, the PCB 302, etc.), a second connection point (e.g., pin, mount, pad, etc.) may be associated with a serial wire debug or programing interface (e.g., of the chiller 102, the PCB 302, etc.), a third connection point (e.g., pin, mount, pad, etc.) may be associated a backup power for a real time clock (e.g., of the PCB 302, etc.), etc. In this regard, each of the plurality of connection points of the PCB 302 (e.g., each of the pins, mounts, pads, etc.) may be associated with a specific function (e.g., of the PCB 302, the chiller 102, etc.), for example to communicate information and/or generate control decisions relating to a piece of building equipment (e.g., the chiller 102), as will be discussed below. In some embodiments, the PCB 302 includes various layers of fiberglass, copper, and epoxy coupled together (e.g., in abutting layers).

In an exemplary embodiment, the MCU module 304 is coupled with the PCB 302, and is configured to communicate one or more signals to/from the PCB 302, components of the controller 210, and/or one or more remote systems or devices (e.g., a user device, etc.). For example, the MCU module 304 may be coupled with the PCB 302, and may be configured to communicate input signals to the PCB 302 and/or output signals from the PCB 302. In this regard, the MCU module 304 may be configured to communicate one or more signals to/from the PCB 302, in order to communicate information and/or generate control signals to/from the chiller 102. According to an exemplary embodiment, the MCU module 304 is an interposer (e.g., formed of a semiconductor material, such as silicon, germanium, diamond, etc., or compound materials such as silicon germanium, silicon carbide, gallium arsenic, indium arsenide, indium phosphide, silicon germanium carbide, gallium arsenic phosphide, gallium indium phosphide, or a combination thereof). In some embodiments, the MCU module 304 is a circuit board (e.g., a printed circuit board, etc.) having a substrate on which circuitry is mounted, printed, or installed.

According to an exemplary embodiment, the MCU module 304 includes a plurality of connection points (e.g., pads), for example to facilitate coupling the MCU module 304 to one or more components of the PCB 302 (e.g., via wiring, bonding, soldering, etc.). For example, the MCU module 304 may include a plurality of connection points (e.g., pads), which may be coupled to one or more components of the PCB 302 and/or the controller 210 (e.g., pins, mounts, circuitry, transistors, diodes, resistors, capacitors, etc.). The couplings between the connection points (e.g., of the MCU module 304) and the components of the PCB 302 and/or the controller 210 may be configured to facilitate communication of input/output signals to/from the PCB 302 and the MCU module 304, for example to perform one or more of the operations described herein. As shown in the exemplary embodiments of FIGS. 4-5, the MCU module 304 includes a plurality of connection points, shown as a plurality of pads, positioned at a bottom surface of the MCU module 304. As will be discussed in great detail below, in an exemplary embodiment each of the plurality of pads are associated with one or more digital, electrical, and/or signal processing functions of the chiller 102 (e.g., the PCB 302, the MCU module 304, etc.). For example, a first pad may be associated with a backup power for a real time clock (e.g., of the PCB 302, etc.), a second pad may be associated with a direct voltage current or power measurement (e.g., from the chiller 102, the PCB 302, etc.), a third pad may be associated with a serial wire or programing interface debug (e.g., of the chiller 102, etc.), etc. In this regard, each of the plurality of pads of the MCU module 304 may be associated with a specific function (e.g., of the chiller 102, the PCB 302, a MCU 306, the MCU module 304, etc.), for example to communicate information and/or generate control decisions relating to a piece of building equipment (e.g., the chiller 102), as discussed below.

Figure 4:
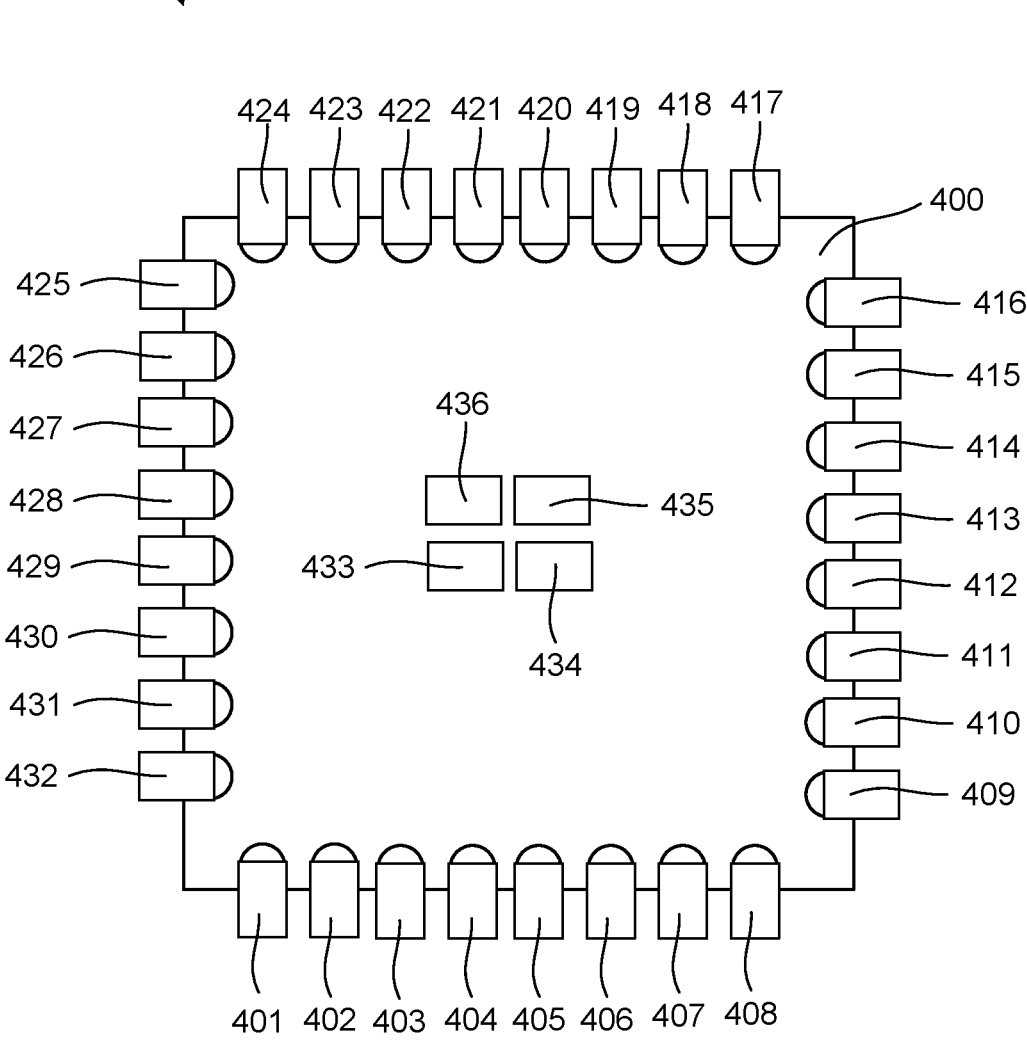
FIG. 4 is a bottom view of a MCU module of the controller of FIG. 3, according to some embodiments.

As shown in the exemplary embodiment of FIG. 4, the MCU module 304 includes a plurality of pads positioned at a bottom surface 400 of the MCU module 304. In an exemplary embodiment, the bottom surface 400 includes a plurality of castellated pads extending around peripheral edges of the MCU module 304. In some embodiments, the plurality of castellated pads include 32 pads (shown as pads 401-432). In an exemplary embodiment, the bottom surface 400 also includes a plurality of land grid array pads positioned at an interior of the MCU module 304. In some embodiments, the plurality of land grid array pads include 4 pads (shown as pads 433-436). For example, the pads 433-436 may be positioned in a square grid at a center of the bottom surface 400 of the MCU module 304. In some embodiments, the bottom surface 400 of the MCU module 304 includes another suitable number of pads (e.g., 20, 25, 30, 25, 40, 50, etc.), which may be otherwise arranged or configured at the bottom surface 400 (e.g., a first set of pads including 20, 25, 30, 25, 40, 45, 50, 55, etc. pads, a second set of pads including 2, 5, 10, 15, 20, etc. pads, a single set of pads, 3, 4, 5, 6, 7, 8, 9, 10, etc. sets of pads, or another suitable configuration). In other embodiments, the bottom surface 400 of the MCU module 304 includes a range of a number of pads (e.g., between 35 and 37 pads, between 33 and 39 pads, between 30 and 40 pads, between 25 and 35 pads, between 35 and 45 pads, between 30 and 50 pads, between 20 and 40 pads, or any other suitable range of pads).

In some embodiments, and as shown in the exemplary embodiment of FIG. 4, the bottom surface 400 of the MCU module 304 is square (e.g., the MCU module 304 is square). For example, the bottom surface 400 may have a peripheral edge length, for example an edge length of 20 mm. In this regard, the MCU module 304 (e.g., the bottom surface 400) may have dimensions of 20 mm by 20 mm. In an exemplary embodiment, the pads 401-432 are castellated around peripheral edges of the MCU module 304 at a pitch. For example, the pads 401-432 may be castellated around peripheral edges of the MCU module 304 at a 2 mm pitch. In some embodiments, the MCU module 304 has a minimum thickness. For example, the MCU module 304 may have a minimum thickness of 0.94 mm. In other embodiments, the MCU module 304 has different dimensions (e.g., 25 mm by 25 mm, etc.) and/or a different shape (e.g., rectangular, circular, etc.), a different thickness (e.g., a minimum thickness of 1.0 mm, etc.), the pads may be otherwise arranged around peripheral edges of the MCU module 304 (e.g., at 2.5 mm pitch, etc.), and/or the components of the MCU module 304 are otherwise arranged.

Figure 5:
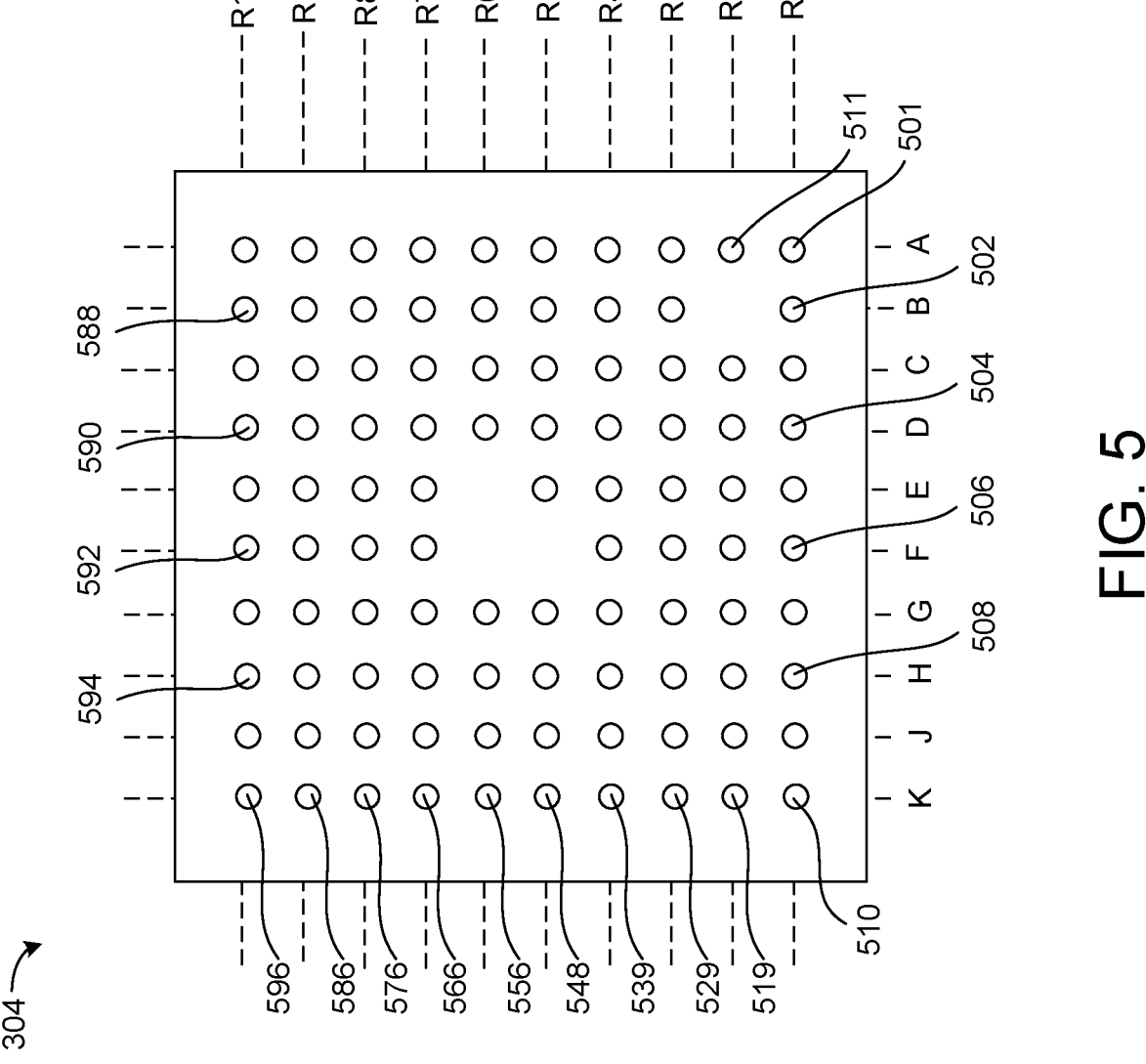
FIG. 5 is a bottom view of a MCU module of the controller of FIG. 3, according to some embodiments.

As shown in the exemplary embodiment of FIG. 5, in other embodiments the MCU module 304 includes a plurality of pads positioned at a bottom surface 500 of the MCU module 304. In an exemplary embodiment, the bottom surface 500 includes a plurality of land grid array pads positioned at an interior of the MCU module 304. For example, the bottom surface 500 may include 96 pads positioned at an interior of the bottom surface 500 (shown as pads 501-596). In some embodiments, the pads 501-596 are positioned in an array, divided into rows (e.g., rows R1-R10) and columns (e.g., columns A-K). In this regard, each of the pads 501-596 may be identified via a row and a column (e.g., R1-A for pad 501, R1-K for pad 510, R2-A for pad 511, etc.). According to an exemplary embodiment, the pads 501-596 are positioned within a square grid at a center of the bottom surface 500 of the MCU module 304. In some embodiments, the bottom surface 500 of the MCU module 304 includes another suitable number of pads (e.g., 80, 85, 90, 100, 105, 110, 120, etc.). In other embodiments, the bottom surface 500 of the MCU module 304 includes a range of a number of pads (e.g., between 95 and 97 pads, between 92 and 100 pads, between 90 and 105 pads, between 85 and 110 pads, between 80 and 115 pads, between 75 and 120 pads, between 70 and 125 pads, or any other suitable range of pads).

In some embodiments, and as shown in the exemplary embodiment of FIG. 5, the bottom surface 500 of the MCU module 304 is square (e.g., the MCU module 304 is square). For example, the bottom surface 500 may have a peripheral edge length, for example an edge length of 30 mm. In this regard, the MCU module 304 (e.g., the bottom surface 500) may have dimensions of 30 mm by 30 mm. In an exemplary embodiment, the pads 501-596 are land grid array pads positioned at an interior of the MCU module 304. In some embodiments, the pads 501-596 have a diameter of approximately 1 mm (e.g., within 10%) and are formed of copper. In other embodiments, the MCU module 304 has a minimum thickness. For example, the MCU module 304 may have a minimum thickness of 0.94 mm. In other embodiments, the MCU module 304 has different dimensions (e.g., 35 mm by 35 mm, etc.) and/or is a different shape (e.g., rectangular, circular, etc.), a different thickness (e.g., a minimum thickness of 1.0 mm, etc.), the pads are otherwise arranged at the MCU module 304 (e.g., around a peripheral edge, otherwise in a land grid array, etc.), and/or components of the MCU module 304 are otherwise arranged.

In yet other embodiments, the MCU module 304 includes a plurality of pads positioned at a bottom surface of the MCU module 304. For example, a bottom surface of the MCU module 304 may include a plurality of land grid array pads positioned at an interior of the MCU module 304. In an exemplary embodiment, the plurality of pads include 188 pads (e.g., arranged in a land grid array). In other embodiments, the plurality of pads include another suitable number of pads (e.g., 150, 175, 190, 200, 220, etc.) and/or pads otherwise positioned at the MCU module 304 (e.g., castellated around peripheral edges, etc.). In other embodiments, the MCU module 304 includes a range of a number of pads (e.g., between 185 and 195 pads, between 180 and 200 pads, between 175 and 210 pads, between 160 and 125 pads, or any other suitable range of pads). In some embodiments, the MCU module 304 (e.g., the bottom surface) has dimensions of 30 mm by 15 mm. In an exemplary embodiment, the MCU module 304 has a minimum thickness, for example a minimum thickness of 0.94 mm. In other embodiments, the MCU module 304 has different dimensions (e.g., 40 mm by 15 mm, 35 mm by 20 mm, etc.) and/or is a different shape (e.g., square, circular, etc.), a different thickness (e.g., a minimum thickness of 1.0 mm, etc.), the pads are otherwise arranged at the MCU module 304 (e.g., around a peripheral edge, otherwise in a land grid array, etc.), and/or components of the MCU module 304 are otherwise arranged or config-ured.

According to an exemplary embodiment, the MCU mod-ule 304 includes a top surface (e.g., top surface 402, top surface 502, not shown) having one or more mounting components. In an exemplary embodiment, the top surface includes one or more mounting components configured to receive a unique MCU (e.g., the MCU 306, a specific make, model, configured, etc. MCU). For example, a first MCU module may include a first set of one or more mounting components configured to receive a first MCU, a second MCU module may include a second set of one or more mounting components configured to receive a second MCU, a third MCU module may have a third set of one or more mounting components configured to receive a third MCU, etc. In this regard, in an exemplary embodiment the con-troller 210 (e.g., the PCB 302) may be configured to selectively couple a MCU module, and the MCU module may be configured to selectively couple unique MCU (e.g., a specific make, model, configured, etc. MCU). According to an exemplary embodiment, a plurality of MCU modules (e.g., the first MCU module, the second MCU module, the third MCU module, etc.) include top surfaces that are different (e.g., different mounting components or configu-ration) and bottom surfaces that are similar (e.g., the bottom surface 400, the bottom surface 500, etc.). As such, in some embodiments the controller 210 (e.g., the PCB 302) is configured to selectively couple one or more MCU modules (e.g., a first MCU module, a second MCU module, a third MCU module, etc.) having similar bottom surfaces and/or connection points (e.g., pads of the bottom surface 400, the bottom surface 500), and different top surfaces (e.g., one or more mounting components) to selectively couple one or more unique MCUs (e.g., a first MCU, a second MCU, a third MCU) to the controller 210 (e.g., the PCB 302).

In some embodiments, the one or more mounting com-ponents include a plurality of receivers or receiving com-ponents, for example to receive a plurality of pins. In some embodiments, the MCU module 304 (e.g., top surface) includes specialty mounts and/or other suitable coupling components, for example to selectively (e.g., removably, etc.) couple the MCU module 304 to one or more compo-nents (e.g., the MCU 306). For example, the MCU module 304 may be configured to selectively (e.g., removably, etc.) coupled a plurality of MCUs (e.g., a first MCU, a second MCU, a third MCU, etc.). In some embodiments, the MCU module 304 includes a receiver or receiving components configured to identify a MCU when the MCU is coupled with the MCU module 304 (e.g., via a unique connection, a unique identification code, etc.).

Referring still to FIG. 3, according to an exemplary embodiment the MCU module 304 is configured to selec-tively couple one or more MCUs, shown as the MCU 306. In an exemplary embodiment, the MCU is a 32 bit MCU, and includes one or more processing components used to implement the various processes, illustrative logics, logical blocks, modules and circuits described in connection with the embodiments disclosed herein. For example, the MCU 306 may include a general purpose single- or multi-chip processor, a digital signal processor (DSP), an application specific integrated circuit (ASIC), a field programmable gate array (FPGA), or other programmable logic device. The general purpose processor may be a microprocessor, or, any conventional processor, controller, microcontroller, or state machine. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure.

According to an exemplary embodiment, the MCU 306 includes a plurality of connection points (e.g., pins, mounts, pads, etc., not shown). For example, the MCU 306 may include 50, 80, 150, 200, or any suitable number of con-nection points (e.g., pins, mounts, etc.). In an exemplary embodiment, the plurality of connection points (e.g., pins, mounts, etc.) are configured to couple one or more mounting and/or coupling components of the MCU module 304 (e.g., receivers, receiving portions, specialty mounts, pads, other coupling components, etc.). For example, the connection points of the MCU 306 may couple with the mounting components of the MCU module 304, and facilitate trans-mission of signals to/from the MCU 306 and the MCU module 304 (e.g., and the PCB 302). In this regard, the MCU 306 may be configured to communicate one or more signals to/from the MCU 306, through the MCU module 304, and to/from the PCB 302 (e.g., the chiller 102). According to an exemplary embodiment, each of the plurality of connection points of the MCU 306 (e.g., pins, mounts, etc.) are asso-ciated with one or more digital, electrical, and/or signal processing functions of the MCU 306. For example, a first connection point (e.g., pin, mount, pad, etc.) may be asso-ciated with a back-up power supply of a real-time clock of the MCU 306, a second connection point (e.g., pin, mount, pad, etc.) may be associated with a reset input of the MCU 306, a third connection point (e.g., pin, mount, pad, etc.) may be associated with a first analog-to-digital converter input, etc. In this regard, each of the plurality of connection points of the MCU 306 may be associated with a specific function of the MCU 306, for example to communicate information and/or generate control decisions relating to the MCU 306 and/or a connected piece of building equipment (e.g., the chiller 102).

MCU Management System and MCU Manager Platform

Figure 6:
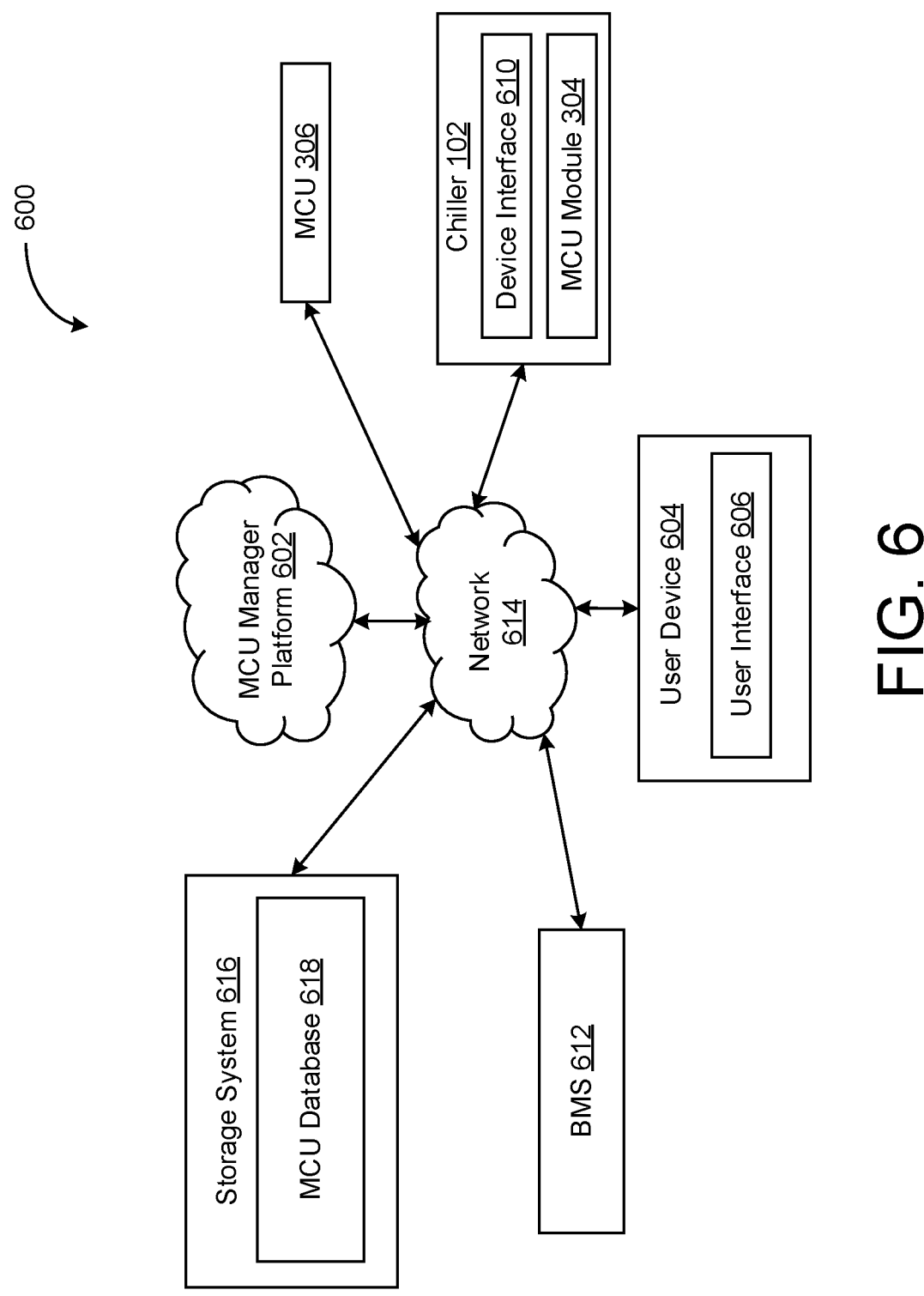
FIG. 6 is a block diagram of a MCU management system which can be used with components of the building of FIG. 1, according to some embodiments.

Referring now to FIG. 6, a block diagram of a MCU management system 600 is shown, according to an exem-plary embodiment. The MCU management system 600 is shown to include a MCU manager platform 602, a user device 604 having a user interface 606, and a device of building equipment, shown as the chiller 102, having a device interface 610 and a MCU module 304, and a MCU 306. It should be understood that while the MCU 306 of the exemplary embodiment of FIG. 6 is shown as separate from the chiller 102 (e.g., and the MCU module 304), in some embodiments the MCU 306 is configured to couple with the chiller 102 (e.g., the MCU module 304). In an exemplary embodiment, the MCU management system 600 also includes one or more building management systems (e.g., a BMS 612), a network 614, and a storage system 616 having a MCU database 618. As will be discussed in greater detail below, the MCU manager platform 602 may be configured to communicate, process, and analyze data (e.g., device data, MCU data, etc.) to generate and/or provide an interface that is configured to correlate (e.g., route) one or more input/ output signals to/from a first device (e.g., a PCB) and a second device (e.g., a MCU).

According to an exemplary embodiment, the MCU manager platform 602 is configured to communicate with one or more components of the MCU management system 600. For example, the MCU manager platform 602 may communicate with the user device 604 (e.g., via the user interface 606, the network 614, etc.). In some embodiments, the MCU manager platform 602 is configured to communicate with the chiller 102 (e.g., via the device interface 610, the network 614, etc.), the MCU module 304 and/or the MCU 306, components of the BMS 612, the storage system 616, and/or any other device or system of the MCU management system 600.

As shown in FIG. 6, the MCU manager platform 602 is configured to communicate with the user device 604 (e.g., via the network 614). The user device 604 may include one or more human-machine interfaces or client interfaces, shown as the user interface 606 (e.g., a graphical user interface, reporting interface, text-based computer interface, client-facing web service, web servers that provide pages to a web client, etc.) for controlling, viewing, and/or otherwise interacting with the MCU manager platform 602. The user device 604 may be a mobile device or a stationary terminal. For example, the user device 604 may be a smartphone, a tablet, a PDA, a laptop computer, a desktop computer, a computer workstation, a client terminal, a computer server with an interface, a remote or local interface, and/or any other type of mobile or non-mobile user interface device.

In some embodiments, the MCU manager platform 602 is configured to communicate with the chiller 102. Like the user device 604, the chiller 102 may include one or more human-machine interfaces or client interfaces, shown as device interface 610, for controlling, viewing, and/or otherwise interacting with the chiller 102. In some embodiments, the chiller 102 is another device of an HVAC system (e.g., a heater, air handling unit, pumps, fans, thermal energy storage, etc., and/or another device configured to provide heating, cooling, ventilation, or other services for a building). In other embodiments, the chiller 102 is a device of an energy generation and/or storage system, a security system, a lighting system, a fire alerting system, and/or a device of any other system capable of managing building functions or devices, or any combination thereof. In yet other embodiments, the chiller 102 is an internet of things (IoT) device capable of communicating with the MCU manager platform 602.

In an exemplary embodiment, the MCU manager platform 602 is configured to communicate with the MCU 306 (e.g., via one or more communications interfaces, the network 614, etc.). In some embodiments, the MCU manager platform 602 is configured to communicate with the MCU module 304 (e.g., via the network 614). In other embodiments, the MCU manager platform 602 is also configured to communicate with components of one or more building management systems (e.g., the BMS 612). In an exemplary embodiment, the MCU manager platform 602 is also configured to communicate with the storage system 616 (e.g., having the MCU database 618), either directly or indirectly (e.g., via the user device 604, the chiller 102, etc.). The storage system 616 may include one or more devices (e.g., RAM, ROM, Flash memory, hard disk storage, etc.) for storing data and/or computer code for completing and/or facilitating various processes, layers, and modules described herein. The storage system 616 may be or include volatile memory or non-volatile memory, and may include database components, object code components, script components, and/or any other type of information structure for supporting the various activities and information structures described herein.

According to an exemplary embodiment, and as will be discussed in greater detail below, the MCU manager platform 602 is also configured to generate data (e.g., an interface, a program, an application, etc.). For example, the MCU manager platform 602 may include components (e.g., a PCB configuration module, a MCU configuration module, a MCU identification module, a comparison analyzer, an interface generator, a MCU interface database, etc.) that receive, analyze, process, generate, store, and/or communicate data. The data generated by the MCU manager platform 602 may be analyzed, processed, stored, etc. along with data received from other data sources discussed above. Further, the MCU manager platform 602 may communicate data generated by the MCU manager platform 602, for example to initiate and/or implement an automated action by one or more components of the MCU management system 600 (e.g., provide an interface or program to the MCU 306, the chiller 102, the MCU module 304, etc. to route one or more input/output signals to/from a first device and a second device to initiate and/or implement an automated action).

MCU Manager Platform

Figure 7:
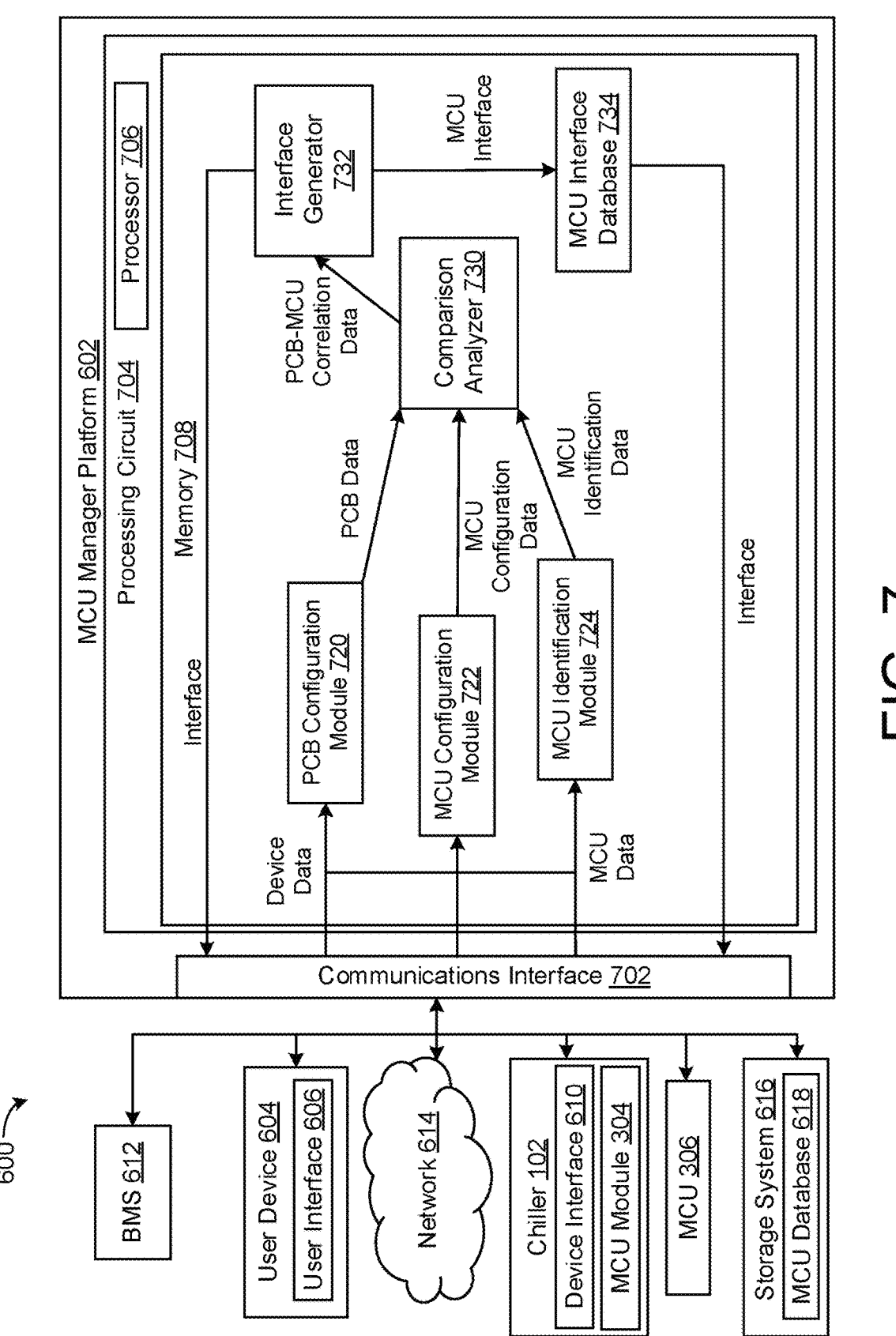
FIG. 7 is a block diagram of a MCU manager platform which can be used with the MCU management system of FIG. 6, according to some embodiments.

Referring now to FIG. 7, a block diagram illustrating the MCU manager platform 602 in greater detail is shown, according to an exemplary embodiment. As discussed above, the MCU manager platform 602 may be configured to receive, analyze, process, generate, store, and/or communicate data, for example to provide an interface (e.g., application programming interface, software program, etc.) configured to route one or more input/output signals to/from a first device and a second device. The interface may be configured to receive one or more input/output signals or calls from a first device (e.g., a MCU, a PCB, a device of building equipment, etc.), correlate the one or more input/output signals or calls with an associated connection point at a second device (e.g., a PCB, a device of building equipment, a MCU, etc.), and route or communicate the one or more input/output signals or calls to the associated connection point at the second device. In this regard, the interface may include a series of associated or automated calls/responses configured to route (e.g., communicate) one or more input/output signals between a first device and a second device having disparate connection-function configurations (e.g., pin-out diagrams, pin-function diagrams, pad-function diagrams, etc.).

As shown in FIG. 7, the MCU manager platform 602 is communicably connected to the user device 604 (e.g., via the user interface 606), the chiller 102 (e.g., via the device interface 610), and the MCU 306 (e.g., via the network 614). In an exemplary embodiment, the MCU manager platform 602 is communicably connected to the storage system 616, and/or other suitable systems and/or devices (e.g., one or more components of the BMS 612). It should be understood that some or all of the components of the MCU manager platform 602, the user device 604, the chiller 102, the MCU 306, the storage system 616, the BMS 612, etc. may be implemented as part of a cloud-based computing system configured to receive, process, and/or communicate data from one or more external devices or sources. Similarly, some or all of the components of the MCU manager platform 602, the user device 604, the chiller 102, the MCU 306, the storage system 616, the BMS 612, etc. may be implemented within a single device, or distributed across multiple separate systems or devices. In some embodiments, some or all of the components of the MCU manager platform 602 are components of a subsystem level controller, a plant controller, a device controller, a field controller, a computer workstation, a client device, and/or another system or devices that receives, processes, and/or communicates data from/to devices or other data sources.

The MCU manager platform 602 is shown to include a communications interface 702 and a processing circuit 704 having a processor 706 and a memory 708. The communications interface 702 may include wired or wireless communications interfaces (e.g., jacks, antennas, transmitters, receivers, transceivers, wire terminals, etc.) for communicating data between the MCU manager platform 602 and external systems or devices (e.g., the user device 604, the chiller 102, the MCU 306, etc., via the network 614). In some embodiments, the communications interface 702 facilitates communication between the MCU manager platform 602 and external applications (e.g., remote systems and applications), so as to allow a remote entity or user to control, monitor, and/or adjust components of the MCU manager platform 602. Communications conducted via the communications interface 702 may be direct (e.g., local wired or wireless communications), or via the network 614 (e.g., a WAN, the Internet, a cellular network, etc.). Further, the communications interface 702 may be configured to communicate with external systems and/or devices using any of a variety of communications protocols (e.g., HTTP (S), WebSocket, CoAP, MQTT, etc.), industrial control protocols (e.g., MTConnect, OPC, OPC-UA, etc.), process automation protocols (e.g., HART, Profibus, etc.), home automation protocols, and/or any of a variety of other protocols. Advantageously, the MCU manager platform 602 may obtain, ingest, and process data from any type of system or device, regardless of the communications protocol used by the system or device.

As shown in FIG. 7, the MCU manager platform 602 is generally shown to include the processing circuit 704 having the processor 706 and the memory 708. While shown as single components, it will be appreciated that the MCU manager platform 602 may include one or more processing circuits including one or more processors and memory. In some embodiments, the MCU manager platform 602 includes a plurality of processors, memories, interfaces, and other components distributed across multiple devices or systems that are communicably coupled. For example, in a cloud-based or distributed implementation, the MCU manager platform 602 may include multiple discrete computing devices, each of which includes a processor 706, memory 708, communications interface 702, and/or other components of the MCU manager platform 602 that are communicably coupled. Tasks performed by the MCU manager platform 602 may be distributed across multiple systems or devices, which may be located within a single building or facility, or distributed across multiple buildings or facilities. In other embodiments, the MCU manager platform 602 itself is implemented within a single computer (e.g., one server, one housing, etc.). All such implementations are contemplated herein.

The processor 706 may be a general purpose or specific purpose processor, an application specific integrated circuit (ASIC), one or more field programmable gate arrays (FPGAs), a group of processing components, or other suitable processing components. The processor 706 may further be configured to execute computer code or instructions stored in the memory 708 or received from other computer readable media (e.g., CDROM, network storage, a remote server, etc.).

The memory 708 may include one or more devices (e.g., memory units, memory devices, storage devices, etc.) for storing data and/or computer code for completing and/or facilitating the various processes described in the present disclosure. The memory 708 may include random access memory (RAM), read-only memory (ROM), hard drive storage, temporary storage, non-volatile memory, flash memory, optical memory, or any other suitable memory for storing software objects and/or computer instructions. In some embodiments, the memory 708 includes database components, object code components, script components, and/or any other type of information structure for supporting the various activities and information structures described in the present disclosure. The memory 708 may be communicably connected to the processor 706 via the processing circuit 704, and may include computer code for executing (e.g., by the processor 706) one or more processes described herein. When the processor 706 executes instructions stored in the memory 708, the processor 706 may generally configure the processing circuit 704 to complete such activities.

According to an exemplary embodiment, the MCU manager platform 602 is configured to communicate with one or more external devices or systems (e.g., via the communications interface 702, the network 614, etc.). For example, the MCU manager platform 602 may receive (e.g., obtain, request, pull, retrieve, etc.) device data from the user device 604, which may include data received via the user interface 606 (e.g., input via the user). In some embodiments, the MCU manager platform 602 receives (e.g., obtains, requests, pulls, retrieves, etc.) device data from the chiller 102 (e.g., via hardcoded programming, device specification data, technical specifications, etc.) and/or the storage system 616. According to an exemplary embodiment, the MCU manager platform 602 is also configured to communicate with one or more external devices or systems (e.g., via the communications interface 702, the network 614, etc.), for example to receive MCU data. For example, the MCU manager platform 602 may be configured to receive (e.g., obtain, request, pull, retrieve, etc.) MCU data from the MCU 306 (e.g., via the network 614). In some embodiments, the MCU manager platform 602 is configured to receive MCU data from the user device 604 (e.g., via data received via the user interface 606), the chiller 102 (e.g., via an automated identification protocol, etc.), and/or the storage system 616 (e.g., via the MCU database 618). In other embodiments, the MCU manager platform 602 is configured to automatically receive device data and/or MCU data. For example, the chiller 102 (e.g., the MCU module 304), the MCU 306, and/or another suitable device or system may be configured to push device data and/or MCU data to the MCU manager platform 602 (e.g., in response to commissioning or installation, upon start-up, in response to coupling one or more components, etc.). As will be discussed in greater detail below, the MCU manager platform 602 may receive device data, MCU data, and/or any other suitable data relating to a building device and/or a MCU.

According to an exemplary embodiment, the MCU manager platform 602 is further configured to store, process, and/or communicate information relating to the device data and/or the MCU data to other components of the MCU management system 600. For example, the MCU manager platform 602 may process device data and/or MCU data, and/or generate and communicate an interface or program (e.g., an application programming interface (API), a software program, etc.) to one or more components of the MCU management system 600. According to an exemplary embodiment, the MCU manager platform 602 is configured to communicate an interface (e.g., API, etc.) to the MCU 306, which may be used to correlate connection points (e.g., pins, output connections, etc.) of the MCU 306 to connection points (e.g., pins, output connections, etc.) of the PCB 302 and/or the MCU module 304. In some embodiments, the MCU manager platform 602 is configured to communicate the interface to other components of the MCU management system 600 (e.g., the MCU module 304, the user device 604, the chiller 102, etc.). In this regard, the MCU manager platform 602 may receive device data and/or MCU data, process and store the data, and communicate an interface (e.g., API, etc.) that may be used to correlate connection points and/or functional features or components of the MCU 306 to connection points and/or functional features or components of the PCB 302 and/or the MCU module 304 (e.g., coupled with the chiller 102).

Referring still to FIG. 7, the MCU manager platform 602 (e.g., the memory 708) is shown to include a PCB configuration module 720, a MCU configuration module 722, a MCU identification module 724, a comparison analyzer 730, an interface generator 732, and a MCU interface database 734. As discussed above, the MCU manager platform 602 (e.g., components 720-734) may receive device data and/or MCU data from one or more components of the MCU management system 600 (e.g., the user device 604, the chiller 102, the MCU 306, the MCU module 304, the storage system 616, etc.). The MCU manager platform 602 (e.g., components 720-734) may further be configured to store, process, modify, and/or communicate the data (e.g., device data, MCU data, other data), for example for additional processing. In an exemplary embodiment, the MCU manager platform 602 (e.g., components 720-734) is configured to store and process the device data and/or the MCU data, for example to generate an interface (e.g., API, software program) that correlates connection points (e.g., pins, output connections, etc.) of a MCU (e.g., the MCU 306) to connection points (e.g., pins, output connections, etc.) of one or more components of a piece of building equipment (e.g., the PCB 302 and/or the MCU module 304 of the chiller 102), for example based on similar functional features or components. In this regard, the MCU manager platform 602 may be configured to generate and/or communicate an interface (e.g., API, software program, etc.), which is configured to analyze input/output signals to/from a MCU or piece of building equipment (e.g., PCB, MCU module, etc.), and route the input/output signals to/from the associated input/output of the piece of building equipment (e.g., PCB, MCU module, etc.) or the MCU.

According to an exemplary embodiment, the PCB configuration module 720 is configured to receive device data. Device data may include a unique identifying code (e.g., unique to the chiller 102), a plurality of unique identifying codes for a plurality of devices, a characteristic of a device or plurality of devices (e.g., year, make, model, device configuration, component parts, component part configuration, etc.), characteristics of a device or component or part (e.g., motor, condenser, pump, heat exchanger, software, security, etc.), and/or any other suitable data relating to a device (e.g., the chiller 102) and/or a plurality of devices.

In an exemplary embodiment, the device data further includes PCB data relating to a PCB of the device (e.g., the PCB 302 of the chiller 102). For example, PCB data may include a unique identifying code (e.g., unique to the PCB 302), characteristics of the PCB (e.g., make, model, PCB configuration, component parts, component part configuration, etc.), characteristics of one or more components or parts of the PCB (e.g., transistors, diodes, resistors, capacitors, etc.), and/or any other suitable data relating to a PCB of the device (e.g., the PCB 302). According to an exemplary embodiment, the device data (e.g., PCB data) includes data correlating one or more connection points of the PCB (e.g., pins, output connections, etc.) to one or more digital, electrical, and/or signal processing functions of the PCB (e.g., the PCB 302). For example, the PCB data may include a correlation (e.g., association, mapping, etc.) between one or more connection points (e.g., pins, etc.) and one or more signals or functions of the PCB (e.g., a direct voltage power source measurement, a serial or software programming interface debug, a backup power for a clock, an analog-to-digital converter input, a general purpose input-output signal, etc.). As shown in Table 1 and Table 2 below, the device data may include one or more sets of PCB data, which include a plurality of correlations (e.g., associations, mappings, etc.) between one or more connection points of a PCB (e.g., pins, output connections, etc.) and one or more digital, electrical, and/or signal processing functions of the PCB (e.g., the PCB 302), shown as one or more signals (e.g., signal 1, signal 2, signal 3, signal n, etc.).

TABLE 1

| PCB Connection Point-Function Data | |
| --- | --- |
| PCB Connection Point | Function |
| 1 | Signal 1 |
| 2 | Signal 2 |
| 3 | Signal 3 |
| . . . | . . . |
| n | Signal n |

TABLE 2

| PCB Connection Point-Function Data | |
| --- | --- |
| PCB Connection Point | Function |
| A1 | Signal 1 |
| A2 | Signal 2 |
| A3 | Signal 3 |
| . . . | . . . |
| Xn | Signal n |

In an exemplary embodiment, the PCB configuration module 720 is further configured to store the device data (e.g., the PCB data), and/or communicate the device data, or a component thereof (e.g., PCB data, etc.), to one or more components of the MCU manager platform 602 (e.g., the memory 708), for example for additional processing. In some embodiments, the PCB configuration module 720 is configured to store the device data (e.g., the PCB data), for example to supplement or replace existing device data (e.g., stored or existing PCB data, etc.). In this regard, in some embodiments, the PCB configuration module 720 is configured to override existing device data (e.g., the PCB data), for example device data stored in the memory 708, the MCU manager platform 602, and/or any other suitable device or system (e.g., the chiller 102, the MCU module 304, a storage system, etc.).

In an exemplary embodiment, the device data further includes MCU module data relating to a MCU module of the device (e.g., the MCU module 304 of the chiller 102). For example, the MCU module data may include a unique identifying code (e.g., unique to the MCU module 304), characteristics of the MCU module (e.g., MCU module configuration, component parts, component part configurations, pad layout configurations, etc.), characteristics of one or more components of the MCU module (e.g., pads, transistors, diodes, resistors, capacitors, etc.), and/or any other suitable data relating to a MCU module of the device (e.g., the MCU module 304). According to an exemplary embodiment, the device data (e.g., MCU module data) includes data correlating one or more connection points of the MCU module (e.g., pads, output connections, connection points, etc.) to one or more digital, electrical, and/or signal processing functions.

For example, the MCU module data may include data correlating one or more connection points of the MCU module (e.g., pads, output connections, etc.) to one or more digital, electrical, and/or signal processing functions of the connection points of the device to which the connection points are coupled (e.g., pins, output connections, etc. of the PCB 302, the chiller 102, etc.). In this regard, it should be understood that while Table 1 and Table 2 above include one or more sets of data that include a plurality of correlations (e.g., associations, mappings, etc.) between one or more connection points of a PCB and one or more digital, electrical, and/or signal processing functions of the PCB, the device data (e.g., MCU module data) may also include one or more sets of data that include a plurality of correlations (e.g., associations, mappings, etc.) between one or more connection points of a MCU module (e.g., pads, output connections, etc. of the MCU module 304) and one or more digital, electrical, and/or signal processing functions, for example of a device to which the MCU module is coupled (e.g., of the PCB 302, the chiller 102). As such, in some embodiments the PCB configuration module 720 is or includes a MCU configuration module, and/or the memory 708 further includes a MCU configuration module. In some embodiments, the PCB configuration module 720 is configured to store the device data (e.g., the MCU module data), for example to supplement or replace existing device data (e.g., stored or existing MCU module data, etc.). In this regard, in some embodiments, the PCB configuration module 720 is configured to override existing device data (e.g., the MCU module data), for example device data stored in the memory 708, the MCU manager platform 602, and/or any other suitable device or system (e.g., the chiller 102, the MCU module 304, a storage system, etc.).

According to an exemplary embodiment, the MCU configuration module 722 is configured to receive MCU data. In an exemplary embodiment, the MCU data is associated with one or more characteristics of a MCU (e.g., the MCU 306). For example, MCU data may include MCU configuration data, including characteristics of the MCU (e.g., MCU configuration, component parts, component part configuration, etc.), characteristics of one or more components or parts of the MCU (e.g., transistors, diodes, resistors, capacitors, etc.), and/or any other suitable data relating to a MCU (e.g., the MCU 306). According to an exemplary embodiment, the MCU data (e.g., MCU configuration data) includes data correlating one or more connection points of the MCU (e.g., pins, output connections, etc.) to one or more digital, electrical, and/or signal processing functions of the MCU (e.g., the MCU 306). For example, the MCU configuration data may include a correlation (e.g., association, mapping, etc.) between one or more connection points (e.g., pins, output connections, etc.) and one or more signals or functions of the MCU (e.g., a direct voltage power source signal, a ground power source signal, a voltage reference signal, an analog-to-digital converter input, a general purpose input-output signal, etc.). As shown in Table 3 and Table 4 below, the MCU data may include one or more sets of MCU configuration data, which include a plurality of correlations (e.g., associations, mappings, etc.) between one or more connection points of a MCU (e.g., pins, output connections, etc.) and one or more digital, electrical, and/or signal processing functions of the MCU (e.g., the MCU 306), shown as one or more signals (e.g., signal 1, signal 2, signal 3, signal n, etc.).

TABLE 3

| | MCU Connection Point-Function Configuration Data | | | |
|---|---|---|---|---|
| Function | MCU 1 Connection Point(s) | MCU 2 Connection Point(s) | MCU 3 Connection Point(s) | MCU 4 Connection Point(s) |
| Signal 1 | 4, 28, 38, 50 | 12, 15, 44, 69 | 10, 24, 41, 67 | 18, 20, 33 |
| Signal 2 | 5, 18, 37 | 8, 21, 34, 68 | 35, 38, 49 | 11 |
| Signal 3 | 11 | Not Used | 66 | 19 |
| Signal 4 | 10 | 4 | 1 | Not Used |
| . . . | . . . | . . . | . . . | . . . |
| Signal n | A | B | C | D |

TABLE 4

| | MCU Connection Point-Function Configuration Data | | | |
|---|---|---|---|---|
| Function | MCU 1 Connection Point(s) | MCU 2 Connection Point(s) | MCU 3 Connection Point(s) | MCU 4 Connection Point(s) |
| Signal 1 | 15, 22, 29, 43 | A3, A10, B10, C11, D19, | E62, F24, G14, H58 | 38, 50, 77 |
| Signal 2 | 56, 78, 89 | C15, C 40, D39 | R35, R49, T11 | 44 |
| Signal 3 | 18 | D 58 | A59 | 39 |
| Signal 4 | 27 | D11 | B37 | 72 |
| . . . | . . . | . . . | . . . | . . . |
| Signal n | An | Bn | Cn | Dn |

In an exemplary embodiment, the MCU configuration module 722 is further configured to store the MCU data (e.g., MCU configuration data), and/or communicate the MCU data, or a component thereof (e.g., MCU configuration data, etc.), to one or more components of the MCU manager platform 602 (e.g., the memory 708), for example for additional processing. In some embodiments, the MCU configuration module 722 is configured to store the MCU data (e.g., the MCU configuration data), for example to supplement or replace existing MCU data (e.g., stored or existing MCU configuration data, etc.). In this regard, in some embodiments, the MCU configuration module 722 is configured to override existing MCU data (e.g., the MCU configuration data), for example MCU data stored in the memory 708, the MCU manager platform 602, and/or any other suitable device or system (e.g., the MCU 306, the storage system 616, the MCU database 618, etc.).

According to an exemplary embodiment, the MCU identification module 724 is also configured to receive MCU data. In an exemplary embodiment, the MCU data also includes MCU identification data unique to a MCU (e.g., the MCU 306). For example, the MCU data (e.g., the MCU identification data) may include a unique identifying code (e.g., unique to the MCU 306, unique to a MCU 1, a MCU 2, a MCU 3, a MCU 4, etc.), a characteristic of the MCU (e.g., year, make, model, etc.), and/or any other suitable data unique to one or more MCUs. In an exemplary embodiment, the MCU identification module 724 is also configured to store the MCU data (e.g., MCU identification data), and/or communicate the MCU data, or a component thereof (e.g., MCU identification data, etc.), to one or more components of the MCU manager platform 602 (e.g., the memory 708), for example for additional processing.

Referring still to FIG. 7, according to an exemplary embodiment the comparison analyzer 730 is configured to receive device data (e.g., PCB data, MCU module data, etc.) and/or MCU data (e.g., MCU configuration data, MCU identification data, etc.). For example, the comparison analyzer 730 may receive PCB data from the PCB configuration module 720, MCU configuration data from the MCU configuration module 722, and/or MCU identification data from the MCU identification module 724. In an exemplary embodiment, the comparison analyzer 730 is also configured to generate and/store PCB-MCU profiles, which represent a correlation (e.g., association, mapping, etc.) between one or more connection points of a PCB and a MCU (e.g., pins, output connections, etc.) to one or more digital, electrical, and/or signal processing functions of the PCB (e.g., the PCB 302) and the MCU (e.g., the MCU 306). For example, the comparison analyzer 730 may generate and store a first PCB-MCU profile, which represents a correlation between one or more functions of the PCB/MCU (e.g., a direct voltage power source signal, a ground power source signal, etc.) and the associated one or more connection points (e.g., pins, output connections, etc.) of the PCB (e.g., connection point 1, connection 32, etc.) and the MCU (e.g., connection point 2, connection point 3, etc.). In this regard, the comparison analyzer 730 may be configured to correlate (e.g., associate, map, etc.) one or more connection-function diagrams of a PCB and a MCU (e.g., pin-out diagram, pin-function diagram, pad-function diagram, etc.), so as to generate and/or store profiles that correlate the functions of the PCB/MCU and the associated connection points.

As indicated above, in an exemplary embodiment, the comparison analyzer 730 is configured to generate and/or store a plurality of PCB-MCU profiles, which correlate a plurality of functions of the PCB and the MCU, and the associated one or more connection points (e.g., pins, output connections, etc.) of the PCB and one or more MCUs. As shown in Table 5 and Table 6 below, the comparison analyzer 730 may be configured to generate and/or store correlations (e.g., associations, mappings, etc.) between the functions of a PCB and one or more MCUs (e.g., shown as signal 1, signal 2, etc.), and the associated one or more connection points (e.g., pins, output connections, etc.) of the PCB and/or one or more MCUs (e.g., using connection-function diagrams, pin-function diagrams, pad-function diagrams, etc.).

tions (e.g., associations, mappings, etc.) between the functions of a PCB and one or more MCUs, and the associated one or more connection points (e.g., pins, output connections, etc.) of the PCB and/or one or more MCUs as a function of one or more models or equations (e.g., predictive models, equipment models, device models, MCU models, state equations, etc.). In some embodiments, the comparison analyzer 730 is configured to generate and/or store correlations (e.g., associations, mappings, etc.) via one or more programming techniques (e.g., rule based analysis, pin-out mapping analysis, etc.). In other embodiments, the comparison analyzer 730 is configured to generate and/or store correlations based on device data, MCU data, or other data received (e.g., retrieved, pulled, obtained, etc.) from one or more devices of the MCU management system 600 (e.g., the user device 604, the chiller 102, the MCU 306, the storage system 616, etc.). In an exemplary embodiment, the comparison analyzer 730 is further configured to store the PCB-MCU profiles (e.g., PCB-MCU correlation data), and/or communicate the PCB-MCU profiles, or a component thereof (e.g., PCB-MCU correlation data), to one or more components of the MCU manager platform 602 (e.g., the memory 708), for example for additional processing. In some embodiments, the comparison analyzer 730 is configured to store the PCB-MCU profiles, for example to supplement or replace existing PCB-MCU profile data (e.g., stored or existing PCB-MCU profiles, etc.). In this regard, in some embodiments, the comparison analyzer 730 is configured to override existing PCB-MCU profiles (e.g., the PCB-MCU profile data), for example PCB-MCU profiles stored in the memory 708, the MCU manager platform 602, and/or any other suitable device or system (e.g., the chiller 102, the MCU module 304, a storage system, a user device, etc.).

TABLE 5

| | PCB-MCU Connection Point-Function Configuration Data | | | | |
| Function | PCB Connection Point(s) | MCU 1 Connection Point(s) | MCU 2 Connection Point(s) | MCU 3 Connection Point(s) | MCU 4 Connection Point(s) |
| --- | --- | --- | --- | --- | --- |
| Signal 1 | 1 | 4, 28, 38, 50 | 12, 15, 44, 69 | 10, 24, 41, 67 | 18, 20, 33 |
| Signal 2 | 2 | 5, 18, 37 | 8, 21, 34, 68 | 35, 38, 49 | 11 |
| Signal 3 | 3 | 11 | Not Used | 66 | 19 |
| Signal 4 | 4 | 10 | 4 | 1 | Not Used |
| . . . | . . . | . . . | . . . | . . . | . . . |
| Signal n | n | A | B | C | D |

TABLE 6

| | PCB-MCU Connection Point-Function Configuration Data | | | | |
| Function | PCB Connection Point(s) | MCU 1 Connection Point(s) | MCU 2 Connection Point(s) | MCU 3 Connection Point(s) | MCU 4 Connection Point(s) |
| --- | --- | --- | --- | --- | --- |
| Signal 1 | A1 | 15, 22, 29, 43 | A3, A10, B10, C11, D19, | E62, F24, G14, H58 | 38, 50, 77 |
| Signal 2 | A2 | 56, 78, 89 | C15, C 40, D39 | R35, R49, T11 | 44 |
| Signal 3 | A3 | 18 | D 58 | A59 | 39 |
| Signal 4 | A4 | 27 | D11 | B37 | 72 |
| . . . | . . . | . . . | . . . | . . . | . . . |
| Signal n | Xn | An | Bn | Cn | Dn |

According to an exemplary embodiment, the comparison analyzer 730 is configured to generate and/or store correla- As noted above, in some embodiments the device data further includes MCU module data relating to a MCU module of the device. The MCU module data may include data correlating one or more connection points of the MCU module (e.g., pads, output connections, connection points, etc.) to one or more digital, electrical, and/or signal processing functions (e.g., via a pad-function diagram, an output-function diagram). For example, the module data may include data correlating one or more connection points (e.g., pads, output connections, etc.) to one or more digital, electrical, and/or signal processing functions of a device to which the MCU module 304 is coupled (e.g., the PCB 302, the chiller 102, etc.). In this regard, it should be understood that while Table 5 and Table 6 above include one or more sets of data that correlate the functions of a PCB and one or more MCUs, and the associated one or more connection points of the PCB and/or one or more MCUs, the comparison analyzer 730 may further be configured to generate and/or store correlations (e.g., associations, mappings, etc.) between the functions of a PCB and/or MCU, and the associated one or more connection points (e.g., pads output connections) of the MCU module 304. As such, in some embodiments the comparison analyzer 730 is configured to generate and/or store MCU module-PCB correlation data and/or MCU module-MCU correlation data.

According to an exemplary embodiment, the interface generator 732 is configured to obtain (e.g., receive, retrieve, pull, request, etc.) PCB-MCU correlation data. For example, the interface generator 732 may be configured to receive PCB-MCU correlation data from the comparison analyzer 730. In an exemplary embodiment, the interface generator 732 is further configured to analyze the PCB-MCU correlation data, and/or generate an interface based on the PCB-MCU correlation data. According to an exemplary embodiment, the interface is an application programming interface (e.g., API), a program, a programming interface, or another suitable software or program. In an exemplary embodiment, the interface is configured to correlate one or more input/output calls or signals (e.g., associated with an input/output signal) to/from a first device, with one or more input/output calls or signals (e.g., associated with an input/output signals) to/from a second device. In this regard, the interface may include a series of associated calls/responses configured to route (e.g., communicate, direct, redirect, etc.) one or more input/output signals or calls between a first device and second device, for example devices having disparate connection-function configurations.

For example, the interface may receive a call from a first device (e.g., an output signal from a first pin of the PCB 302), correlate the call of the first device with an associated call/response of a second device (e.g., an output signal of a second pin of the first MCU), and route the call/response to the associated component of the second device (e.g., the second pin of the first MCU). In some embodiments, the interface receives a call or signal from the first device at a first point on a connection-function diagram (e.g., a first pin of the PCB 302), and routes the call/response or signal to a second point on a connection-function diagram of the second device (e.g., a second pin of the MCU 306). In this regard, the interface may be configured to receive and/or route calls/signals between different (but associated) connection points of a first device (e.g., the PCB 302) and a second device (e.g., the MCU 306), for example to facilitate communication and/or routing of signals between devices having disparate connection-function diagrams (e.g., pin-out diagrams, pin-function diagrams, pad-function diagrams).

In an exemplary embodiment, the interface generator 732 is configured to generate a plurality of interfaces based on a plurality of PCB-MCU correlation data sets. For example, the interface generator 732 may generate a first interface for a first PCB-MCU combination (e.g., based on a first set of PCB-MCU correlation data), a second interface for a second PCB-MCU combination (e.g., based on a second set of PCB-MCU correlation data), a third interface for a third PCB-MCU combination (e.g., based on a third set of PCB-MCU correlation data), etc. In some embodiments, the plurality of interfaces include one or more common workflows or routing calls (or responses). For example, the plurality of interfaces may include one or more workflows or routing calls (or responses) that route associated (e.g., common, similar, the same, etc.) calls/responses to a common component of the first device (e.g., a connection point of the PCB 302). In this regard, the plurality of interfaces may include one or more workflows or routing calls (or responses) that route associated signals (e.g., common, similar, the same, etc.) from disparate components of second devices (e.g., a first connection point of the first MCU, a second connection point of the second MCU, a tenth connection point of the third MCU, etc.) to a common component of the first device (e.g., a first connection point of the PCB 302). As such, the interface (or plurality of interfaces) may be configured to receive and/or route calls/signals between different (but associated) connection points of second devices (e.g., a first MCU, a second MCU, a third MCU, etc.) and a connection point of a first device (e.g., a first connection point of the PCB 302).

According to an exemplary embodiment, the interface is configured to correlate one or more signals or calls between a PCB (e.g., the PCB 302) and one or more MCUs (e.g., the MCU 306), for example based on PCB-MCU correlation data. In this regard, the interface may be configured to receive, analyze, and/or route calls and/or signals between a PCB (e.g., the PCB 302) and a MCU (e.g., the MCU 306) based on the PCB-MCU correlation data (e.g., from the comparison analyzer 730). In some embodiments, the interface is configured to correlate one or more signals or calls from a MC (e.g., the MCU 306) and one or more connection points on a MCU module (e.g., a pad of the MCU module 304), for example based on MCU module-MCU correlation data. In this regard, the interface may also be configured to receive, analyze, and/or rout calls and/or signals between a MCU (e.g., MCU 306) and a connection point on the MCU module 304 based on the MCU module-MCU correlation data (e.g., from the comparison analyzer 730). In yet other embodiments, the interface is further configured to correlate one or more signals or calls between other components of the MCU management system 600 (e.g., the PCB 302 and connection points of the MCU module 304, the chiller 102 and connection points of the MCU module 304, etc.).

According to an exemplary embodiment, the interface generator 732 is also configured to generate and/or communicate the interface to one or more components of the MCU management system 600 (e.g., via the communications interface 702, the network 614). For example, the interface generator 732 may be configured to communicate the interface to a MCU (e.g., the MCU 306). In this regard, the interface generator 732 may be configured to communicate the interface to the MCU 306, for example to facilitate correlating (e.g., routing, etc.) input/output signals or calls to/from the MCU 306 and one or more devices to which the MCU 306 is coupled (e.g., the chiller 102, the MCU module 304, etc.). In some embodiments, the interface generator 732 is configured to communicate the interface to the chiller 102 (e.g., the PCB 302), for example to facilitate correlating (e.g., routing, etc.) input/output signals or calls to/from the chiller 102 (e.g., the PCB 302) and one or more devices to which the chiller 102 (e.g., the PCB 302) is coupled (e.g., the MCU 306, the MCU module 304). In other embodiments, the interface generator 732 is configured to communicate the interface to a MCU module (e.g., the MCU module 304), for example to facilitate correlating (e.g., routing, etc.) input/ output signals or calls to/from one or more components the MCU module 304 is coupled with (e.g., input/output signals to/from the chiller 102 and/or the MCU 306, input/output signals between the chiller 102 and the MCU 306, etc.).

In an exemplary embodiment, the interface generator 732 is further configured to communicate the interface to other devices and/or systems. For example, the interface generator 732 may communicate the interface to the MCU interface database 734. The MCU interface database 734 may be configured to receive, store, and/or communicate the inter- face (e.g., interface data), for example for subsequent inter- face generation. In some embodiments, the MCU interface database 734 also receives, stores, and/or communicates device data (e.g., PCB data, etc.) via the PCB configuration module 720, MCU data (e.g., MCU configuration data) via the MCU configuration module 722 and/or (e.g., MCU identification data) via the MCU identification module 724, and/or any other suitable data relating to a building device and/or MCU.

Flow Diagrams

Figure 8:
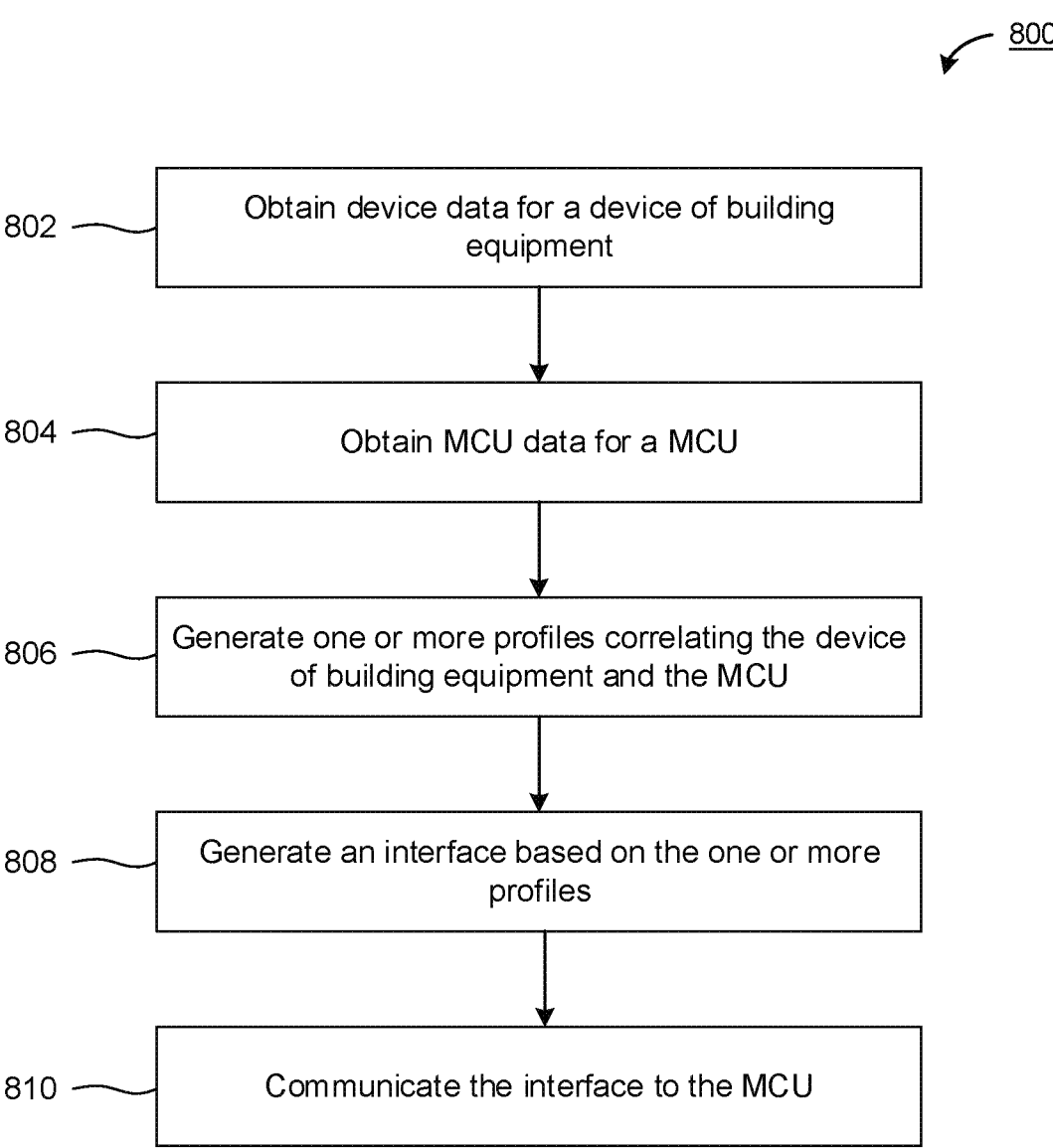
FIG. 8 is a flow diagram of a process for correlating signals or calls between a first device and a second device to monitor or control one or more devices of FIGS. 1-7.

Referring now to FIG. 8, a process for correlating input/ output signals or calls to/from a first device and a second device to monitor and/or control one or more devices is shown, according to an exemplary embodiment. Process 800 may be implemented by any and/or all of the components of the MCU management system 600 of FIG. 6 and/or the MCU manager platform 602 of FIGS. 6-7. Process 800 may also be implemented using the components of FIGS. 1-5. It should be understood that all or part of the process 800 may be implemented by other systems, devices, and/or compo- nents. It should also be understood that in some embodi- ments, process 800 is implemented using additional, differ- ent, and/or fewer steps.

Process 800 is shown to include obtaining device data for a device of building equipment (step 802), according to an exemplary embodiment. The device data may be obtained (e.g., received, requested, retrieved, pulled, etc.) from a device of building equipment (e.g., the chiller 102) or a component thereof (e.g., the MCU module 304), a user device (e.g., the user device 604), a storage system (e.g., storage system 616), one or more components of a BMS (e.g., the BMS 612), and/or any other suitable system or device. In an exemplary embodiment, the device data includes PCB data relating to a PCB of the device (e.g., the PCB 302 of the chiller 102). The PCB day may include data correlating (e.g., associating, mapping, etc.) one or more connection points of a PCB (e.g., pins, output connections, etc.) to one or more digital, electrical, and/or signal pro- cessing functions of the PCB. In some embodiments, the device data includes MCU module data relating to a MCU module of the device (e.g., the MCU module 304 of the chiller 102). The MCU module data may include data correlating (e.g., associating, mapping, etc.) one or more connection points of a MCU module (e.g., pads, connection points, etc.) to one or more digital, electrical, and/or signal processing functions of the MCU module. In some embodi- ments, the device data is obtained automatically, for example the device of building equipment or component thereof (e.g., the chiller 102, the MCU module 304, etc.) may be configured to automatically push the device data.

Process 800 is shown to include obtaining MCU data for a MCU (step 804), according to an exemplary embodiment.

The MCU data may be obtained (E.g., received, requested, retrieved, pulled, etc.) from a MCU (e.g., the MCU 306), a device of building equipment (e.g., the chiller 102) or a component thereof (e.g., the MCU module 304), a user device (e.g., the user device 604), a storage system (e.g., storage system 616, the MCU database 618), one or more components of a BMS (e.g., the BMS 612), or another suitable system or device. In an exemplary embodiment, the MCU data includes MCU configuration data and/or MCU identification data. According to an exemplary embodiment, the MCU configuration data includes data correlating one or more connection points of the MCU (e.g., pins, output connections, etc.) to one or more digital, electrical, and/or signal processing functions of the MCU (e.g., the MCU 306). The MCU identification data may also include unique identifying information associated with one or more MCUs, for example a unique code associated with the MCU 306. In some embodiments, the MCU data is obtained automati- cally, for example the MCU (e.g., MCU 306) and/or device of building equipment or component thereof (e.g., the chiller 102, the MCU module 304, etc.) that the MCU 306 is coupled with may be configured to automatically push the MCU data.

Process 800 is shown to include generating one or more profiles correlating the device of building equipment and the MCU (step 806), according to an exemplary embodiment. In an exemplary embodiment, the one or more profiles are PCB-MCU profiles. For example, the PCB-MCU profiles may correlate (e.g., associate, map, etc.) one or more con- nection points of a PCB (e.g., the PCB 302) and a MCU (e.g., the MCU 306) to one or more digital, electrical, and/or signal processing functions of the PCB and the MCU. In this regard, the PCB-MCU profiles may represent a correlation (e.g., association, mapping, etc.) between the functions of a PCB and one or more MCUs, and the associated one or more connection points (e.g., pins, output connections, etc.) of the PCB and/or one or more MCUs. In some embodiments, the one or more profiles are MCU module-MCU profiles. For example, the MCU module-MCU profiles may correlate (e.g., associate, map, etc.) one or more connection points of a MCU (e.g., the MCU 306) and connection points of the MCU module (e.g., pads of the MCU module 304) associ- ated with one or more digital, electrical, and/or signal processing functions (e.g., of the MCU 306). In this regard, the MCU module-MCU profiles may represent a correlation (e.g., association, mapping, etc.) between the functions of a MCU (and associated connection points) and connection points of a MCU module (e.g., pads of the MCU module 304) associated with those digital, electrical, and/or signal processing functions. In yet other embodiments, the one or more profiles are MCU-module-PCB profiles. For example, the MCU module-PCB profiles may correlate (e.g., associ- ate, map, etc.) one or more connection points of a PCB (e.g., PCB 302) and connection points of the MCU module (e.g., pads of the MCU module 304) associated with one or more digital, electrical, and/or signal processing functions (e.g., of the PCB 302). In this regard, the MCU module-PCB profiles may represent a correlation (e.g., association, mapping, etc.) between the functions of a PCB (and associated connection points) and connection points of a MCU module (e.g., pads of the MCU module 304) associated with those digital, electrical, and/or signal processing functions. In some embodiments, the correlations (e.g., profiles, etc.) are gen- erated using one or more models, algorithms, and/or equa- tions. In other embodiments, the correlations are generated using one or more rules based algorithms, inputs from one or more devices or systems (e.g., the user device 604, etc.), and/or another suitable device or system.

Process 800 is shown to include generating an interface based on the one or more profiles correlating the device of building equipment and the MCU (step 808), according to an exemplary embodiment. In an exemplary embodiment, the interface is an API, a program, a programming interface, or another software or program. The interface may be configured to correlate one or more input/output calls or signals (e.g., associated with an input/output signal) to/from a first device, with one or more input/output calls or signals (e.g., associated with an input/output signal) to/from a second device. For example, the interface may receive a call from a first device (e.g., an output signal from a first pin of the PCB 302), correlate the call of the first device with an associated call/response of a second device (e.g., an output signal of a second pin of the first MCU), and route the call/response to the associated component of the second device (e.g., the second pin of the first MCU). In some embodiments, the interface is configured to receive a call or signal from the first device at a first point on a connection-function diagram (e.g., a first pin of the PCB 302), and route the call/response or signal to a second point on a connection-function diagram of the second device (e.g., a second pin of the MCU 306). In this regard, the interface may be configured to receive, analyze, and/or route calls and/or signals between a PCB (e.g., the PCB 302) and a MCU (e.g., the MCU 306) when the PCB and MCU have disparate connection-function diagrams. In some embodiments, the interface is configured to receive, analyze, and/or route calls and/or signals between a MCU (e.g., the MCU 306) and a MCU module (e.g., one or more pads of the MCU module 304). In other embodiments, the interface is configured to receive, analyze, and/or route calls and/or signals between a PCB (e.g., the PCB 302) and a MCU module (e.g., one or more pads of the MCU module 304).

Process 800 is shown to include communicating the interface to a device or system, according to an exemplary embodiment. In an exemplary embodiment, process 800 includes communicating the interface to the MCU 306 (step 810). In this regard, the MCU 306 may be configured to correlate (e.g., route, etc.) input/output signals or calls to/from the MCU 306, and one or more devices to which the MCU 306 is coupled (e.g., the chiller 102, the MCU module 304). In some embodiments, the interface is communicated to a device of building equipment (e.g., the chiller 102). In this regard, the chiller 102 may be configured to correlate (e.g., route, etc.) input/output signals or calls to/from the chiller 102 (e.g., the PCB 302) and one or more devices to which the chiller 102 (e.g., the PCB 302) is coupled (e.g., the MCU 306, the MCU module 304). In other embodiments, the interface is communicated to a MCU module (e.g., the MCU module 304). In this regard, the MCU module 304 may be configured to correlate (e.g., route, etc.) input/output signals or calls to/from one or more components the MCU module 304 is coupled with (e.g., input/output signals to/from the chiller 102 and/or the MCU 306). As such, process 800 may be implemented to provide an interface capable of communicating (e.g., correlating, routing, etc.) input/output signals or calls between one or more devices having different configurations (e.g., different connection points, pins, output connections, etc. associated with different digital, electrical, and/or processing functions).

Figure 9:
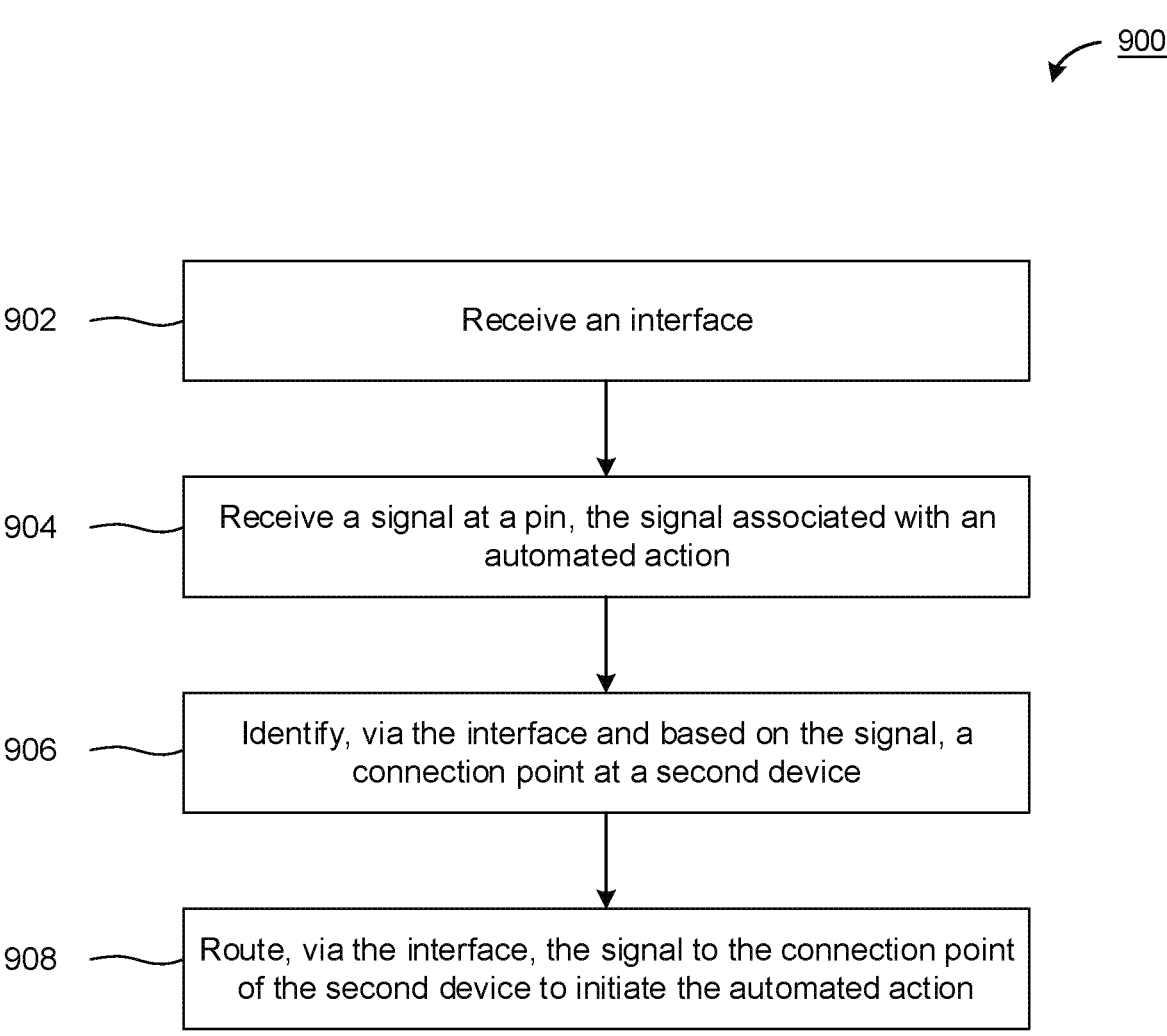
FIG. 9 is a flow diagram of a process for communicating signals or calls between a first device and a second device to monitor or control one or more devices of FIGS. 1-7.
Figure 10:
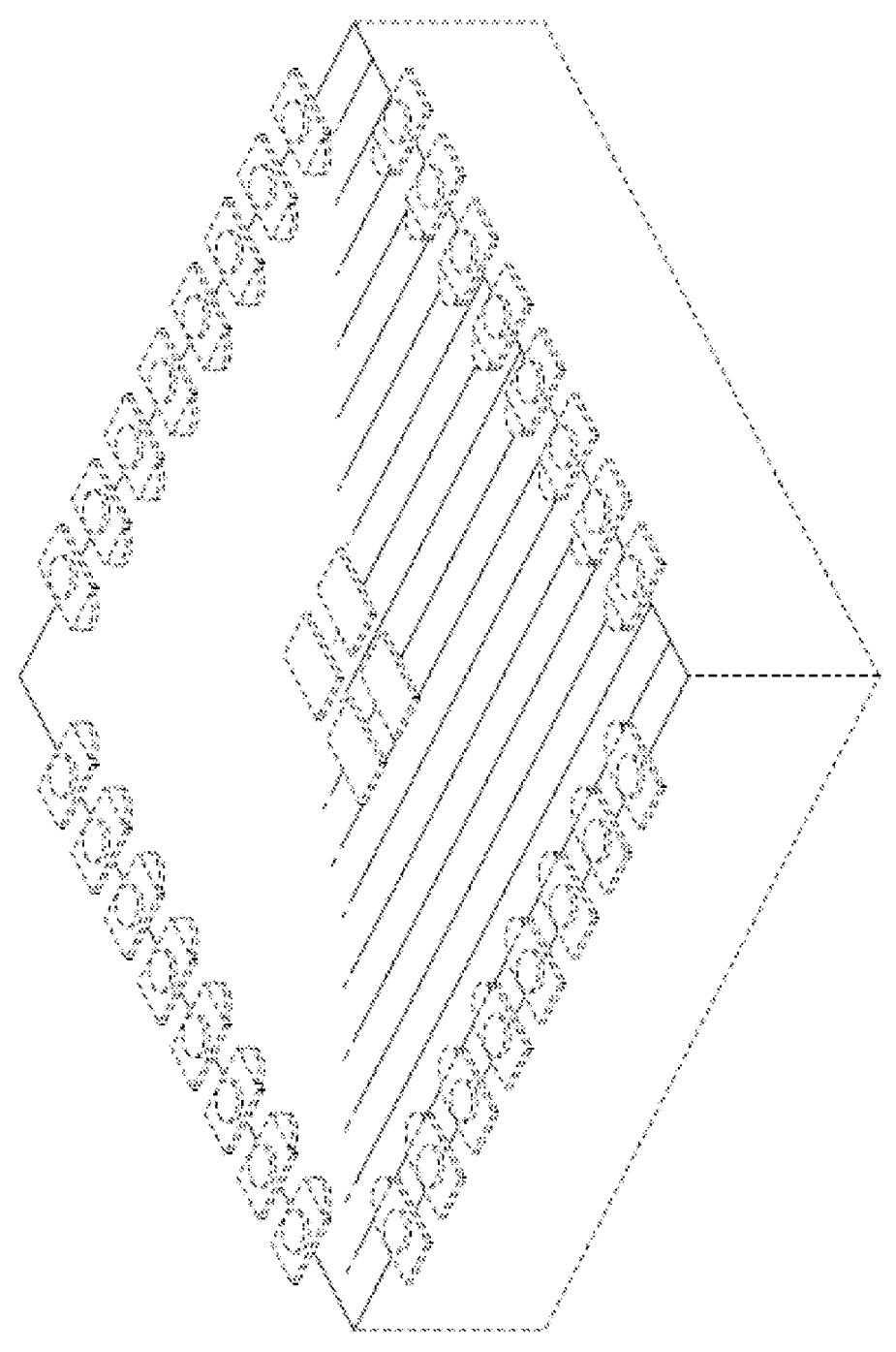
FIG. 10 is a bottom perspective view of a MCU module of the controller of FIG. 3, according to some embodiments.
Figure 11:
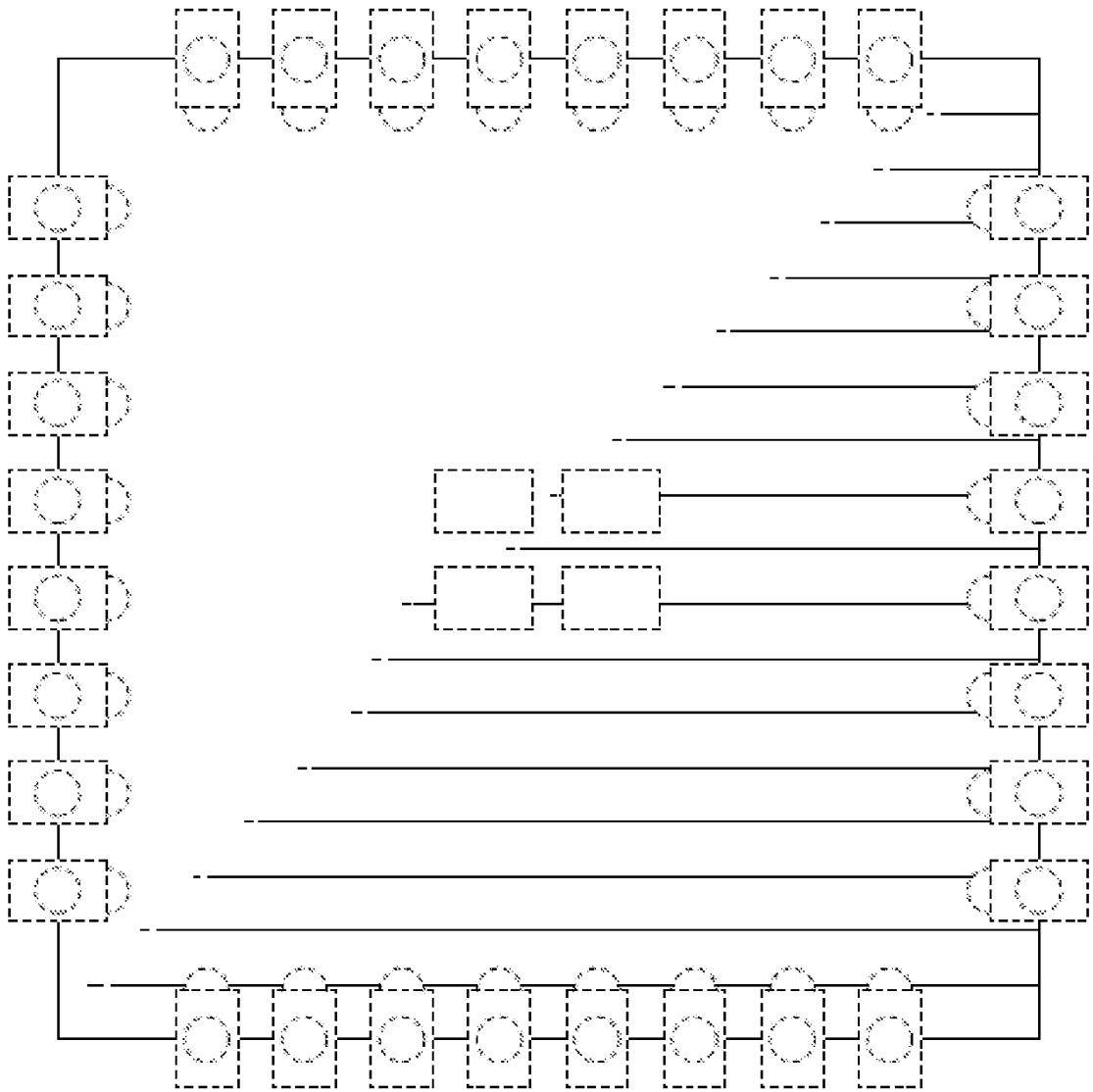
FIG. 11 is a bottom view of the MCU module of FIG. 10, according to some embodiments.
Figure 12:
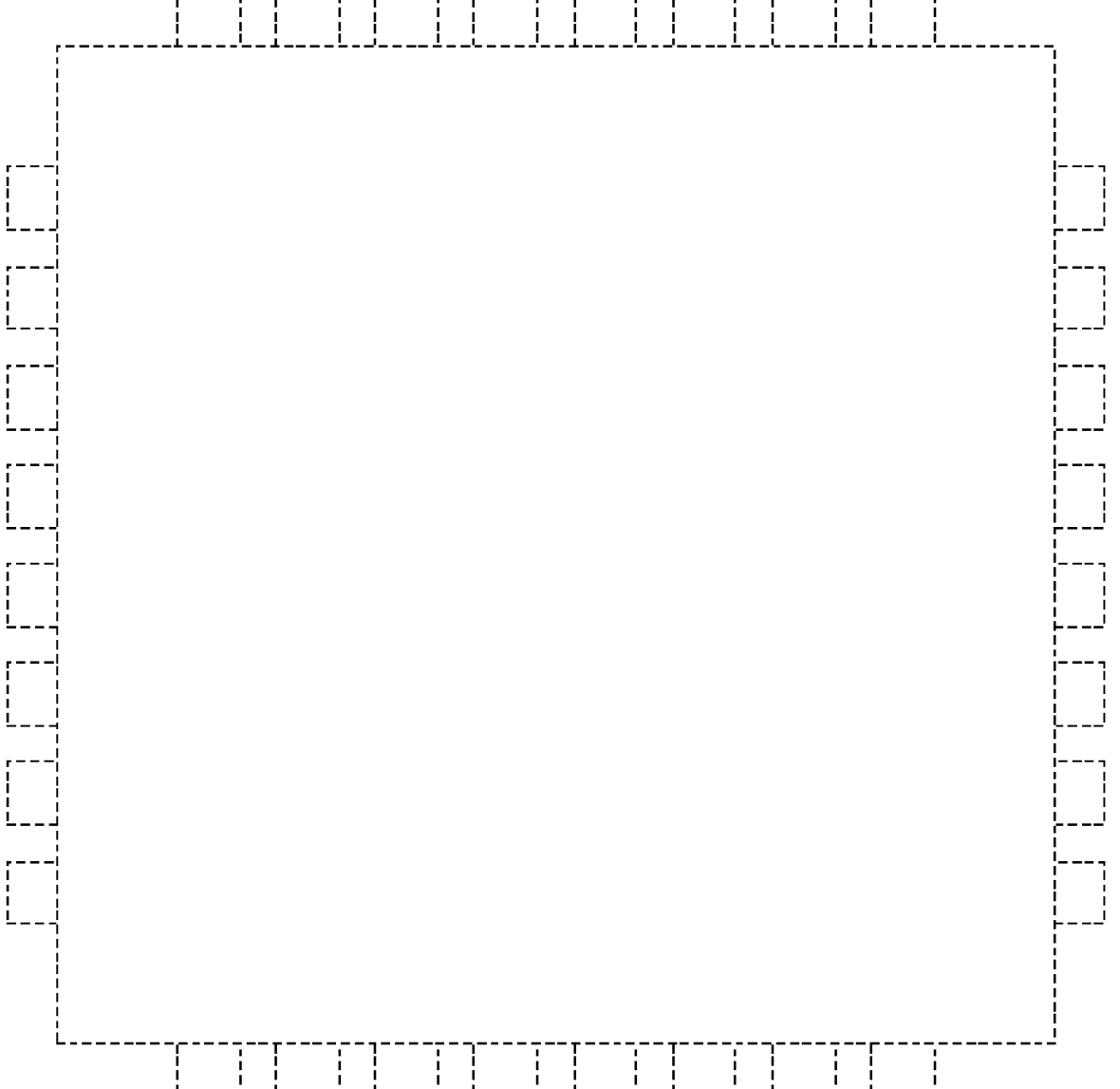
FIG. 12 is a top view of the MCU module of FIG. 10, according to some embodiments.
Figure 13:
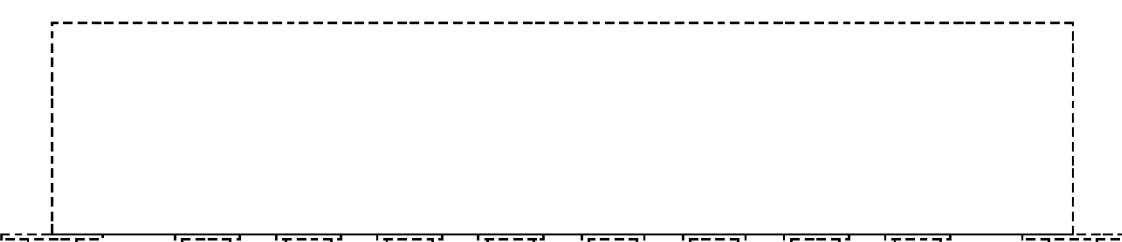
FIG. 13 is a left side view of the MCU module of FIG. 10, according to some embodiments.
Figure 14:
FIG. 14 is a right side view of the MCU module of FIG. 10, according to some embodiments.
Figure 15:
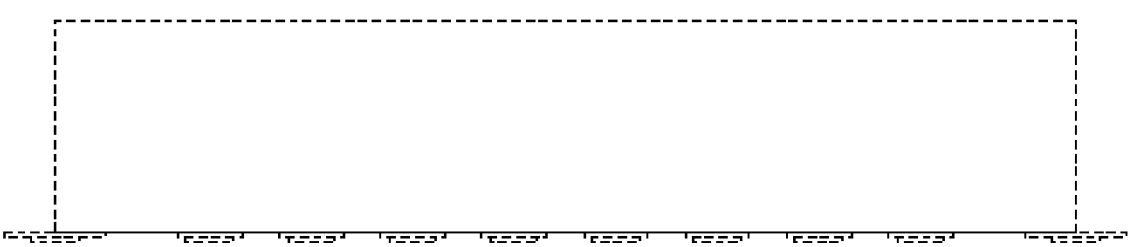
FIG. 15 is a front view of the MCU module of FIG. 10, according to some embodiment.
Figure 16:
FIG. 16 is a rear view of the MCU module of FIG. 10, according to some embodiments.
Figure 17:
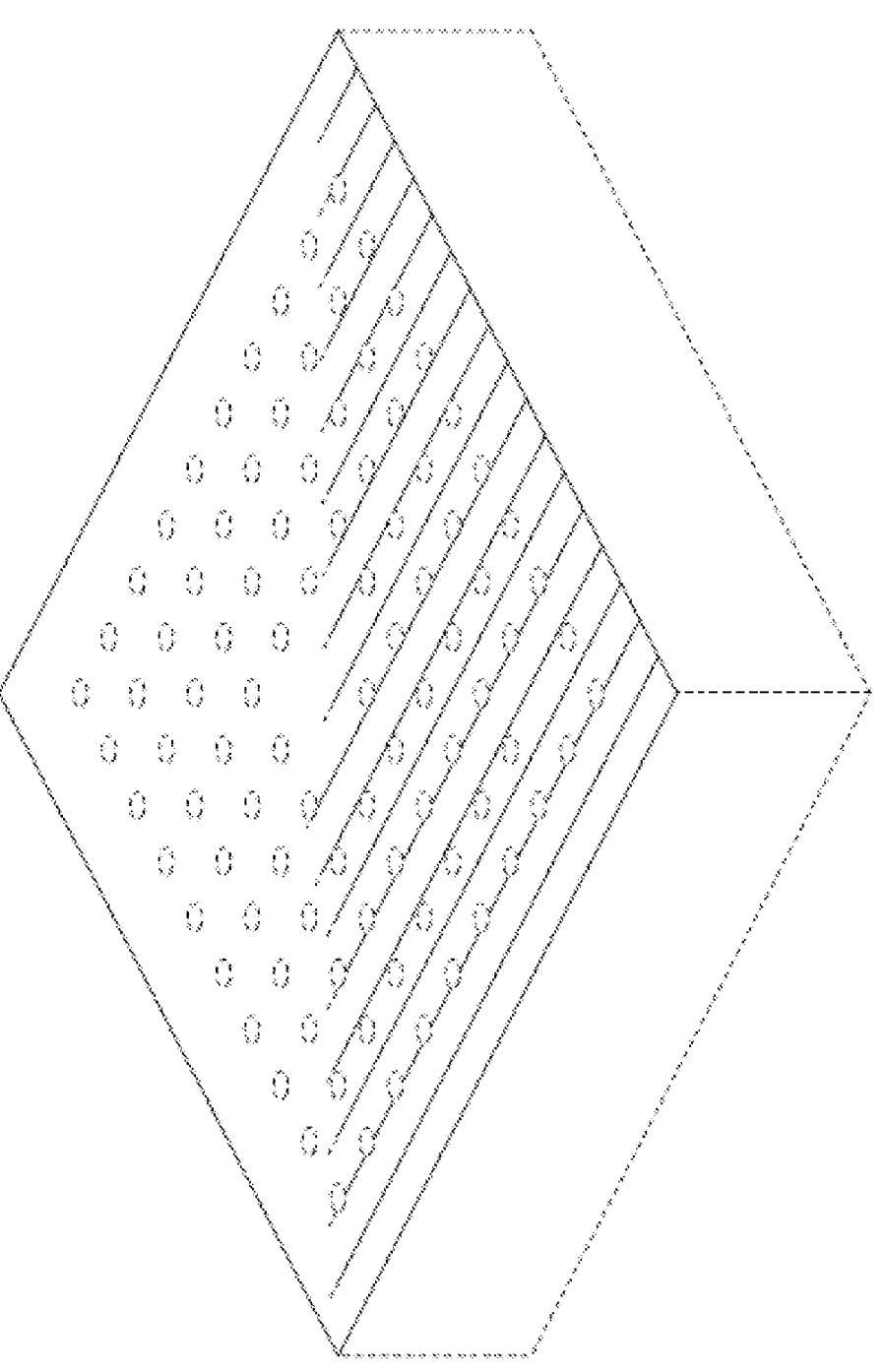
FIG. 17 is a bottom perspective view of a MCU module of the controller of FIG. 3, according to another embodiment.
Figure 18:
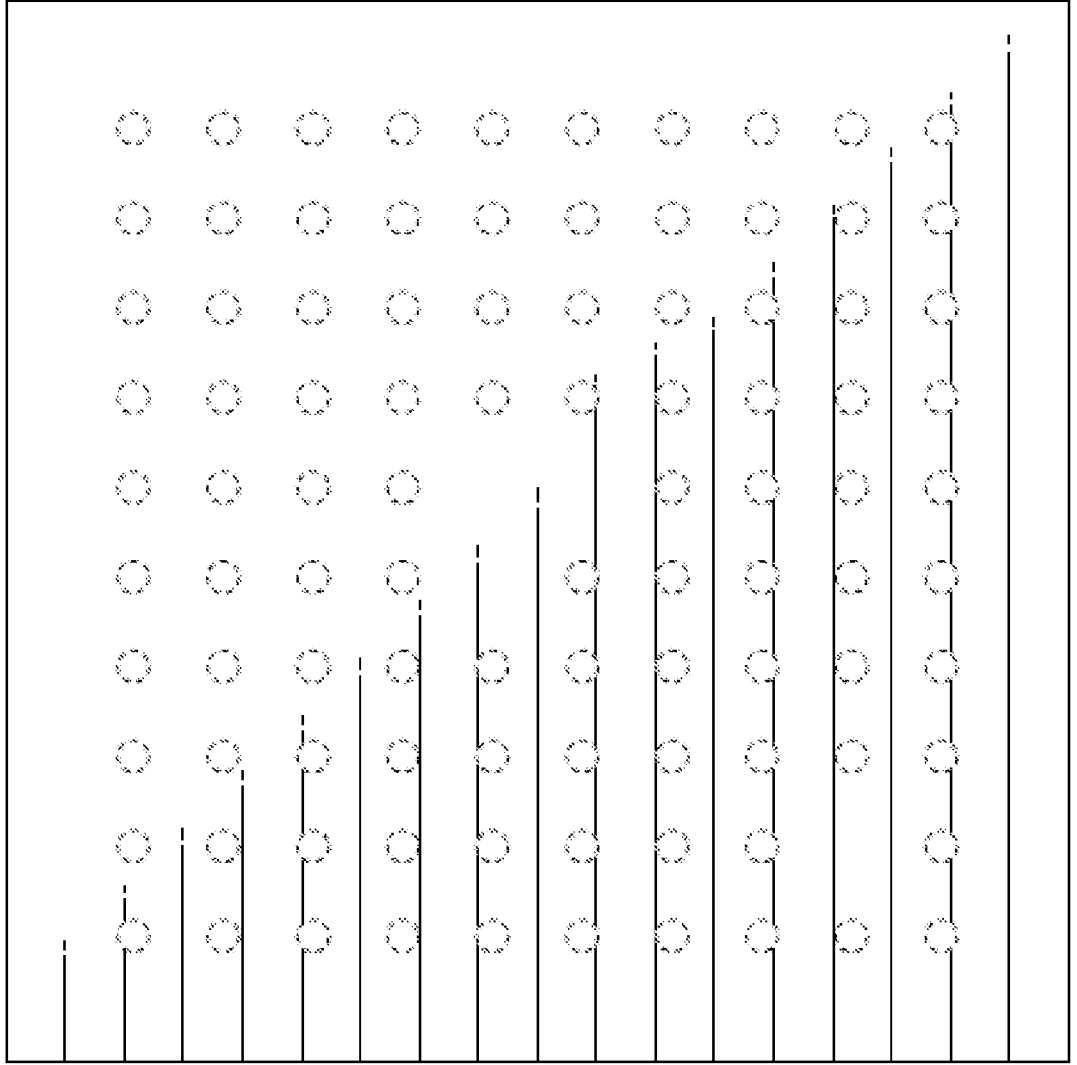
FIG. 18 is a bottom view of the MCU module of FIG. 17, according to some embodiments.
Figure 19:
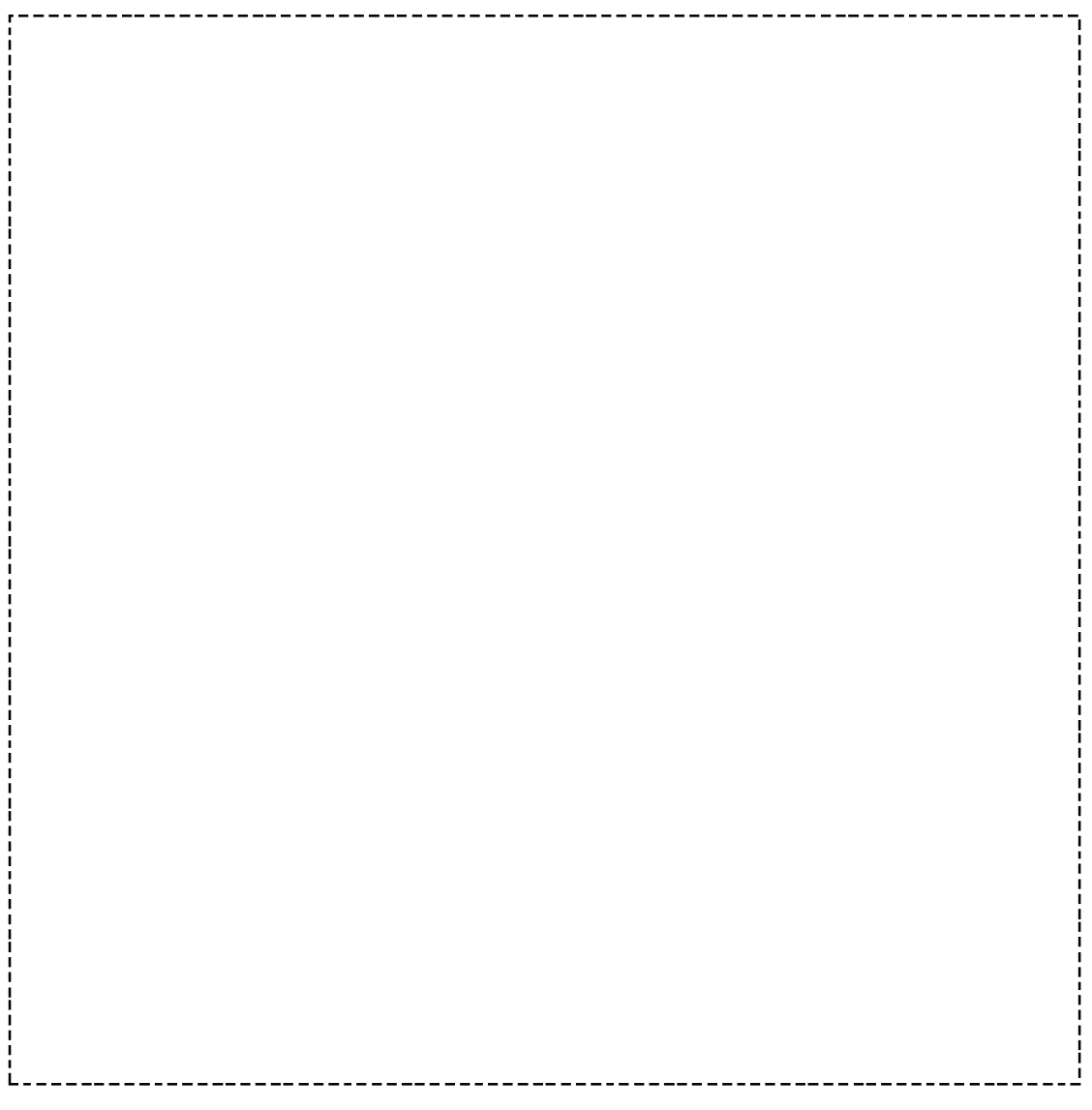
FIG. 19 is a top view of the MCU module of FIG. 17, according to some embodiments.
Figure 20:
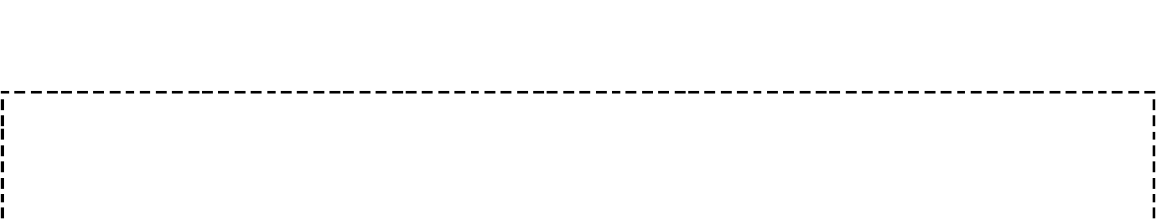
FIG. 20 is a left side view of the MCU module of FIG. 17, according to some embodiments.
Figure 21:
FIG. 21 is a right side view of the MCU module of FIG. 17, according to some embodiments.
Figure 22:
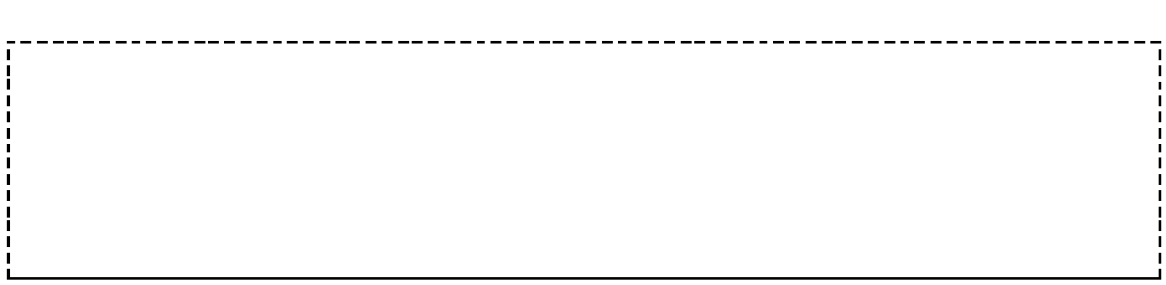
FIG. 22 is a front view of the MCU module of FIG. 17, according to some embodiments.
Figure 23:
FIG. 23 is a rear view of the MCU module of FIG. 17, according to some embodiments.

Referring now to FIG. 9, a process of communicating one or more input/output signals or calls to/from a first device and a second device to monitor and/or control one or more devices is shown, according to an exemplary embodiment.

Process 900 may be implemented by any and/or all of the components of the MCU management system 600 of FIG. 6. In an exemplary embodiment, process 900 is implemented by a MCU (e.g., the MCU 306). For example, the MCU 306 may be coupled with a device of building equipment (e.g., the chiller 102, the MCU module 304), and implement the process 900. In some embodiments, some or all of the steps of process 900 may be implemented when the MCU 306 is separate from the device of building equipment (e.g., de-coupled from the chiller 102, the MCU module 304, etc.). Process 900 may also be implemented using the components of FIGS. 1-5. It should be understood that all or part of the process 900 may be implemented by other systems, devices, and/or components. It should also be understood that in some embodiments, process 900 is implemented using additional, different, and/or fewer steps.

Process 900 is shown to include receiving an interface (step 902), according to an exemplary embodiment. In an exemplary, the interface is received at a MCU (e.g., MCU 306). The interface may be an API, a program, a programming interface, or another software or program. The interface may be configured to correlate one or more input/output calls or signals (e.g., associated with an input/output signal) to/from a first device, with one or more input/output calls or signals (e.g., associated with an input/output signal) to/from a second device, as discussed below. In some embodiments, the interface is received at a device of building equipment (e.g., the chiller 102). In other embodiments, the interface is received at a module (e.g., the MCU module 304). In yet other embodiments, the interface is received at another device and/or system.

Process 900 is shown to include receiving a signal at a connection point (step 904), according to an exemplary embodiment. According to an exemplary embodiment, the signal is received at a pin (e.g., a first pin) of a plurality of pins of a MCU (e.g., the MCU 306). In an exemplary embodiment, each of the plurality of connection points (e.g., pins, mounts, etc.) of the MCU (e.g., the MCU 306) are associated with one or more digital, electrical, and/or signal processing functions of the MCU (e.g., the MCU 306). For example, each of the plurality of connection points (e.g., pins, mounts, etc.) of the MCU (e.g., the MCU 306) may be associated with one or more automated actions (e.g., an indicator relating to a direct voltage current or power measurement, a backup power for a real time clock, a serial wire debug or programing interface, etc., a control signal or decision to control one or more components of a device or system, etc.). In an exemplary embodiment, the connection points are coupled with one or more components, for example a component of a device of building equipment (e.g., the chiller 102) or a component thereof (e.g., the MCU module 304). In this regard, each of the plurality of connection points (e.g., pins, mounts, etc.) of the MCU (e.g., the MCU 306) may be associated with one or more automated actions to communicate information and/or issue control decision to the device of building equipment (e.g., the chiller 102) and/or a component thereof (e.g., the MCU module 304). In some embodiments, the signal is received at a connection point of a device of building equipment (e.g., the chiller 102). In other embodiments, the signal is received at a connection point of a module (e.g., the MCU module 304). In yet other embodiments, the signal is received at another device and/or system/

Process 900 is shown to include identifying a connection point of a second device, according to an exemplary embodiment. In an exemplary embodiment, identifying the connection point of the second device is done via the interface and based on the signal (step 906). The interface may be programed to include one or more profiles, for example profiles that correlate (e.g., associate, map, etc.) one or more connection points of a first device and a second device to one or more digital, electrical, and/or signal processing functions (e.g., automated actions) of the first device and the second device. In this regard, the interface may identify (e.g., based on the profiles) a connection point of a second device (e.g., a PCB), which may be associated with a connection point (e.g., pin, etc.) of the first device (e.g., a MCU). In an exemplary embodiment, the interface is programmed to include one or more PCB-MCU profiles. For example, the interface may include PCB-MCU profiles that represent a correlation between the functions of a PCB (e.g., the PCB 302) and one or more MCUs, and the associated one or more connection points (e.g., pins, output connections, etc.) of the PCB and/or one or more MCUs. In some embodiments, the one or more profiles are MCU module-MCU profiles, for example to correlate one or more connection points of a MCU (e.g., the MCU 306) and connection points of the MCU module (e.g., pads of the MCU module 304) associated with one or more digital, electrical, and/or signal processing functions (e.g., of the MCU 306). In other embodiments, the one or more profiles are MCU module-PBC profiles, for example to correlate one or more connection points of a PCB (e.g., PCB 302) and connection points of the MCU module (e.g., pads of the MCU module 304) associated with one or more digital, electrical, and/or signal processing functions (e.g., of the PCB 302).

Process 900 is shown to include routing the signal to the connection point of the second device, according to an exemplary embodiment. In an exemplary embodiment, routing the signal to the connection point is done via the interface (step 908), for example in response to identifying the connection point of the second device (e.g., as discussed above in step 906). In some embodiments, routing includes communicating the signal to the connection point of the second device to initiate an automated action. As discussed above, an automated action may include providing an indication relating to a device (e.g., the MCU 306, the chiller 102, the MCU module 304, etc., including an alert, a message, and indicator, a status, a characteristic, etc.), controlling one or more components of a device (e.g., the MCU 306, the chiller 102, etc., for example to adjust operating conditions, initiate an operating action, etc.), and/ or communicating information to and/or controlling one or more components of another system or device (e.g., a user device, a BMS, a storage system, etc.). In this regard, process 900 may be implemented to receive an interface capable of communicating (e.g., correlating, routing, etc.) input/output signals or calls between one or more devices having disparate configurations (e.g., different connection points, pins, output connections, etc. associated with different digital, electrical, and/or processing functions), for example to initiate one or more automated action at one or more devices (e.g., the MCU 306, the chiller 102, the MCU module 304, etc.).

Design of a MCU Module

Referring generally to FIGS. 10-23, a MCU module is shown, according to various exemplary embodiments.

Referring now to FIGS. 10-16, a MCU module is shown, according to an exemplary embodiment. In an exemplary embodiment, the MCU module of FIGS. 10-16 is the MCU module 304 of FIGS. 3-9. FIGS. 10-16 show different views of the MCU module (e.g., the MCU module 304). For example, FIGS. 10-16 show a bottom perspective view (e.g., shown in at least FIG. 10), a bottom view (e.g., shown in at least FIG. 11), a top view (e.g., shown in at least FIG. 12), a left side view (e.g., shown in at least FIG. 13), a right side view (e.g., shown in at least FIG. 14), a front view (e.g., shown in at least FIG. 15), and a rear view (e.g., shown in at least FIG. 16) of the MCU module (e.g., the MCU module 304).

Referring now to FIGS. 17-23, a MCU module is shown, according to an exemplary embodiment. In an exemplary embodiment, the MCU module of FIGS. 17-23 is the MCU module 304 of FIGS. 3-9. FIGS. 17-23 show different views of the MCU module (e.g., the MCU module 304). For example, FIGS. 17-23 show a bottom perspective view (e.g., shown in at least FIG. 17), a bottom view (e.g., shown in at least FIG. 18), a top view (e.g., shown in at least FIG. 19), a left side view (e.g., shown in at least FIG. 20), a right side view (e.g., shown in at least FIG. 21), a front view (e.g., shown in at least FIG. 22), and a rear view (e.g., shown in at least FIG. 23) of the MCU module (e.g., the MCU module 304).

The ornamental design of an MCU module is shown in the exemplary embodiments of FIGS. 10-23. In some embodiments, the ornamental design of what is claimed is shown in solid lines in the drawings. In an exemplary embodiment, the broken lines (e.g., showing a housing, a mounting interface, and/or other components, etc.) are for illustrative purposes only, and form no part of the claimed design. Broken lines formed by equal length dashes show unclaimed portions of the design.

While the accompanying drawings illustrate one or more exemplary embodiments, it should be understood that according to other exemplary embodiments that should be considered to be within the possession of the inventors of the present application at the time this application is being filed, it is contemplated that any illustrated solid lines (or portions thereof) may be converted to broken lines and that any illustrated broken lines (or portions thereof) may be converted to solid lines so as to claim or disclaim portions, components, or sub-components of the designs shown. It is further contemplated that shading may be added or removed to claim or disclaim the corresponding surfaces.

Configuration of Exemplary Embodiments

As utilized herein with respect to numerical ranges, the terms "approximately," "about," "substantially," and similar terms generally mean +/−10% of the disclosed values, unless specified otherwise. As utilized herein with respect to structural features (e.g., to describe shape, size, orientation, direction, relative position, etc.), the terms "approximately," "about," "substantially," and similar terms are meant to cover minor variations in structure that may result from, for example, the manufacturing or assembly process and are intended to have a broad meaning in harmony with the common and accepted usage by those of ordinary skill in the art to which the subject matter of this disclosure pertains. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above.

It is important to note that any element disclosed in one embodiment may be incorporated or utilized with any other embodiment disclosed herein. For example, the MCU of the exemplary embodiment described in at least FIGS. 6-7 may be incorporated in the chiller of the exemplary embodiment described in at least FIGS. 1-3. Although only one example of an element from one embodiment that can be incorporated or utilized in another embodiment has been described above, it should be appreciated that other elements of the various embodiments may be incorporated or utilized with any of the other embodiments disclosed herein.

What is claimed:

1. A building device, comprising:
a circuit board having a plurality of connection points; and
a microcontroller (MCU) module having a plurality of pads and a plurality of receivers, each of the plurality of pads to connect to one of the plurality of connection points of the circuit board, and each of the plurality of receivers is configured to removably couple to a pin of a plurality of pins of a microcontroller,
wherein the microcontroller is configured to provide, to an application programming interface (API), a call associated with a signal at a pin of the plurality of pins of the microcontroller, and route, via the API, the signal from the pin to a connection point of the plurality of connection points of the circuit board.

2. The building device of claim 1, wherein the plurality of pads are positioned at a bottom surface of the MCU module.

3. The building device of claim 2, wherein the plurality of pads include a first set of castellated pads extending from the bottom surface of the MCU module, and a second set of land grid array pads positioned at a center of the bottom surface of the MCU module.

4. The building device of claim 3, wherein the plurality of pads include a range of pads between 30 and 40 pads.

5. The building device of claim 2 wherein the plurality of pads include a set of land grid array pads positioned at a center of the bottom surface of the MCU module.

6. The building device of claim 5, wherein the plurality of pads includes a range of pads between 90 and 100 pads.

7. The building device of claim 1, wherein a first pad of the plurality of pads of the MCU module is associated with a first function of the circuit board, and wherein the MCU module is configured to communicate the signal from a first pin of the plurality of pins of the microcontroller to the first pad of the plurality of pads of the MCU module.

8. The building device of claim 1, wherein the plurality of pads of the MCU module are arranged in a numeric pad-function diagram, and wherein the plurality of pins of the microcontroller are arranged in a numeric pin-function diagram, wherein a first pad and a first pin have different functions.

9. A system for monitoring and controlling a device of building equipment, the system comprising:

one or more memory devices having instructions stored thereon that, when executed by one or more processors, cause the one or more processors to perform operations comprising:

receiving, via the device of building equipment, device data relating to the device of building equipment;

receiving, via a microcontroller (MCU), MCU data relating to the MCU;

generating one or more profiles correlating the device of building equipment and the MCU based on the device data and the MCU data;

generating, based on the one or more profiles, an application programming interface (API), wherein the API is configured to route a signal from a pin of the MCU to one or more connection points of a circuit board of the device of building equipment; and communicating the API to the MCU, wherein the MCU is configured to provide, to the API, a call associated with the signal at a pin of the MCU, and route, via the API, the signal from the pin of the MCU to the one or more connection points of the circuit board of the device of building equipment to initiate an automated action.

10. The system of claim 9, wherein generating the one or more profiles includes correlating a function associated with the one or more connection points of the circuit board and a function associated with the pin of the MCU.

11. The system of claim 9, wherein generating the one or more profiles includes correlating a function associated with the pin of the MCU and a connection pad of a MCU module coupled with the circuit board.

12. The system of claim 9, wherein the API is configured to initiate a response, wherein the response is configured to route the signal to the one or more connection points of the circuit board of the device of building equipment.

13. The system of claim 9, wherein the API is configured to initiate a response, the response is configured to route the signal to a connection pad of a MCU module coupled with the circuit board.

14. A device for monitoring and controlling building equipment, the device comprising:

a plurality of pins, each of the plurality of pins associated with an automated action of the device; and one or more memory devices having instructions stored thereon that, when executed by one or more processors, cause the one or more processors to perform operations comprising:

receiving an application programming interface (API);

receiving, via the API, a call associated with a signal at a first pin of the plurality of pins, wherein the signal is associated with a first automated action;

identifying, via the API and based on the signal, a connection point of a second device; and routing, via the API, the signal to the connection point of the second device to initiate the first automated action.

15. The device of claim 14, wherein the connection point is associated with the first automated action, and wherein identifying the connection point of the second device includes correlating the signal associated with the first automated action and the connection point associated with the first automated action.

16. The device of claim 14, wherein the second device is a circuit board of a device of building equipment, and wherein the connection point is a pin of a plurality of pins of the circuit board.

17. The device of claim 14, wherein the second device is a microcontroller (MCU) module, and wherein the connection point is a pad of a plurality of pads of the MCU module.

18. The device of claim 14, wherein the operations further comprise:

initiating, via the API and responsive to receiving the call, a response to route the signal to the connection point of the second device.

19. The device of claim 14, the operations further comprising:

receiving an additional signal at a second pin of the plurality of pins;

identifying, via the API and based on the additional signal, a second connection point of the second device; and routing, via the API, the additional signal to the second connection point of the second device, wherein the connection point and the second connection point are the same.

* * * * *